(12) United States Patent
Ebina

(10) Patent No.: US 6,521,948 B2
(45) Date of Patent: Feb. 18, 2003

(54) SOI-STRUCTURE MIS FIELD-EFFECT TRANSISTOR WITH GATE CONTACTING BODY REGION

(75) Inventor: Akihiko Ebina, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 19 days.

(21) Appl. No.: 09/731,922

(22) Filed: Dec. 8, 2000

(65) Prior Publication Data

US 2001/0015461 A1 Aug. 23, 2001

(30) Foreign Application Priority Data

Dec. 8, 1999 (JP) .......................................... 11-349201

(51) Int. Cl.$^7$ .......................... H01L 27/01; H01L 27/12; H01L 31/0392
(52) U.S. Cl. ........................ 257/347; 257/348; 257/349; 257/350; 257/354
(58) Field of Search .................. 257/347–349, 257/350, 354

(56) References Cited

U.S. PATENT DOCUMENTS 4,611,220 A  *  9/1986  MacIver ..................... 357/23.7
5,753,955 A  *  5/1998  Fechner ...................... 257/347
5,844,272 A  * 12/1998  Soderbarg et al. .......... 257/328
6,103,564 A  *  8/2000  Masuda ...................... 438/237
6,288,425 B1 *  9/2001  Adan ......................... 257/347

FOREIGN PATENT DOCUMENTS

EP              456059 A1 * 11/1991 ................. 257/347

OTHER PUBLICATIONS

U.S. Patent Application No. 09/626,606.

* cited by examiner

Primary Examiner—Jerome Jackson
Assistant Examiner—Jesse A. Fenty
(74) Attorney, Agent, or Firm—Oliff & Berridge, PLC

(57) ABSTRACT

A SOI-structure MOS field-effect transistor. In this transistor, a gate electrode and a p$^-$ region that is a body region are placed into electrical contact by a PN junction portion. An n$^+$-type portion of the PN junction portion is in electrical contact with the gate electrode and a p$^+$-type portion of the PN junction portion is in electrical contact with a p$^-$ region. When a positive voltage is applied to the gate electrode, the above configuration ensures that a reverse voltage is applied to the PN junction portion, so that only a small current on the order of the reverse leakage current of the PN junction flows along the path from the gate electrode, to the PN junction portion and the body region, and into the source region.

12 Claims, 25 Drawing Sheets

SOI-STRUCTURE MIS FIELD-EFFECT TRANSISTOR WITH GATE CONTACTING BODY REGION

BACKGROUND OF THE INVENTION

1. Field of the Invention

The present invention relates to a metal insulator semiconductor (MIS) field-effect transistor of a silicon-on-insulator (SOI) structure, and a method of manufacture thereof.

2. Description of Related Art

A SOI-structure MOS field-effect transistor can be driven at a lower power consumption and a higher speed than an ordinary MOS field-effect transistor.

A schematic view of an example of a conventional SOI-structure MOS field-effect transistor is shown in FIG. 32. A buried oxide film 1100 formed of a silicon oxide layer is formed on a silicon substrate 1000. A source region 1200 and a drain region 1300 are provided in mutually separate locations on the buried oxide film 1100. A body region 1400 is formed on the buried oxide film 1100, between the source region 1200 and the drain region 1300. A gate electrode 1500 is formed on the body region 1400 with a gate insulation film therebetween.

The body region 1400 of the MOS field-effect transistor of FIG. 32 is in a floating state. Thus carriers generated by impact ionization tend to accumulate in the body region 1400. If carriers accumulate, the potential of the body region 1400 changes. This phenomenon is called the substrate floating effect. This causes various problems in the MOS field-effect transistor, such as the kink phenomenon and the parasitic bipolar effect.

There is a SOI-structure MOS field-effect transistor which can suppress this substrate floating effect. A schematic view of such a MOS field-effect transistor is shown in FIG. 33. This MOS field-effect transistor is called a dynamic threshold-voltage MOSFET (DTMOS). It differs from the MOS field-effect transistor shown in FIG. 32 in that the body region 1400 and the gate electrode 1500 are placed in electrical contact. This connection makes it possible for excess carriers that have accumulated within the body region 1400 to be drawn out of the body region 1400. This stabilizes the potential of the body region, making it possible to prevent the occurrence of the substrate floating effect. In addition, any rise in the gate voltage leads to a rise in the body potential, so it is possible that the ON current will increase and also the OFF current will decrease.

However, a DTMOS has another problem in that it can only be used in practice under low gate voltage conditions of a gate voltage on the order of 1 V or less. Specifically, a voltage that is applied to the body region in a DTMOS is of the same magnitude as the voltage applied to the gate electrode thereof. The application of a voltage to the body region causes a forward bias voltage to be applied to the PN junction formed by the body region and the source region. Since the breakdown voltage in the forward direction of a PN junction is usually on the order of 0.7 V, any increase in the gate voltage beyond that point will cause a large current to flow between the body region and the source region. This current will make it impossible to achieve the lower power consumption that is the objective of a SOI structure. Such a current would cause errors in the operation of the circuitry comprising the SOI structure. In addition, since a small forward-direction current flows between the body region and the source region, even when the DTMOS is used at a gate voltage of less than 0.7 V, this impedes any reduction in the power consumption.

SUMMARY OF THE INVENTION

An objective of the present invention is to provide a metal insulator semiconductor (MIS) field-effect transistor of silicon-on-insulator (SOI) structure and a method of manufacture thereof that make it possible to achieve a lower power consumption, even during use under conditions of a comparatively high gate voltage.

According to a first aspect of the present invention, there is provided a metal insulator semiconductor (MIS) field-effect transistor of a silicon-on-insulator (SOI) structure, comprising a source region, a drain region, a body region, a gate electrode, and a PN junction portion, wherein the body region is interposed between the source region and the drain region;

wherein the body region is electrically connected to the gate electrode by the PN junction portion; and wherein the PN junction portion is disposed in such a manner that when a voltage is applied to the gate electrode, a reverse voltage is applied to the PN junction portion.

The present invention having the above described configuration achieves the effects discussed below. In accordance with the present invention, the PN junction portion is disposed between the gate electrode and the body region, in a path that travels from the gate electrode, through the body region, and into the source region. The PN junction portion is disposed in such a manner that when a voltage is applied to the gate electrode, a reverse voltage is applied to the PN junction portion. Thus, when a voltage is applied to the gate electrode, a reverse voltage is applied to the PN junction portion, which ensures that only a small current on the order of the reverse leakage current of the PN junction flows along that path. This makes it possible to restrain the power consumption of the SOI-structure MIS field-effect transistor, even when it is used under conditions of a comparatively high gate voltage.

Note that this current suppression effect can be achieved even when a resistor is disposed between the gate electrode and the body region in the path from the gate electrode, through the body region, and into the source region. However, the PN junction portion to which a reverse voltage is applied, as in the present invention, makes it possible to achieve an effect that is similar to the current suppression effect of a resistor though an area of the PN junction is smaller than that of the resistor.

Note that an ordinary diode or a Zener diode could be used as the type of the PN junction portion in accordance with the present invention. The material of the PN junction portion of the present invention could be polysilicon or silicon single crystal, by way of example. The types and materials cited above are merely given as examples, and it should be obvious that these could be selected as appropriate from consideration of factors such as the voltage range of the device and the device dimensions.

The PN junction portion in accordance with the present invention could be formed at two different positions, by way of example.

With one position, the MIS field-effect transistor may further comprise an extended portion extending from an end portion of the gate electrode and the PN junction portion may be included in the extended portion.

With the second position, the MIS field-effect transistor may be formed on a silicon-on-insulator (SOI) substrate, and the PN junction portion may be formed within a silicon single crystal layer of the SOI substrate.

The MIS field-effect transistor of the present invention that is provided with the above described extended portion could be in either of two states, by way of example.

In the first state, the MIS field-effect transistor of the SOI structure maybe formed on a silicon-on-insulator (SOI) substrate and further comprise an interlayer dielectric and a connecting layer, wherein the interlayer dielectric is formed to cover the extended portion and a silicon single crystal layer of the SOI substrate;

wherein the interlayer dielectric has a hole through which is exposed part of the extended portion and the silicon single crystal layer of the SOI substrate; and wherein the connecting layer is formed in the hole to electrically connect the extended portion to the silicon single crystal layer of the SOI substrate.

In the second state, the MIS field-effect transistor of the SOI structure may be formed on a silicon-on-insulator (SOI) substrate and further comprise an insulating layer, wherein the insulating layer is positioned between the extended portion and a silicon single crystal layer of the SOI substrate;

wherein the insulating layer has a hole through which is exposed part of the silicon single crystal layer of the SOI substrate; and wherein the extended portion is electrically connected to the silicon single crystal layer of the SOI substrate through the hole.

The transistor of the present invention having a structure in which the PN junction portion is formed in the silicon single crystal layer of the SOI substrate could be in the following state, by way of example.

The MIS field-effect transistor of the SOI structure may further comprise an interlayer dielectric and a wiring layer, wherein the interlayer dielectric is formed to cover the silicon single crystal layer of the SOI substrate;

wherein the interlayer dielectric has a first hole through which is exposed part of the silicon single crystal layer of the SOI substrate, and a second hole through which is exposed part of the gate electrode;

wherein the wiring layer is formed on the interlayer dielectric; and wherein the wiring layer is electrically connected to the silicon single crystal layer of the SOI substrate by the first hole, and is also electrically connected to the gate electrode by the second hole.

According to a second aspect of the present invention, there is provided a method of manufacturing a metal insulator semiconductor (MIS) field-effect transistor of a silicon-on-insulator (SOI) structure, the method comprising the steps of:

(a) forming a body region in a silicon-on-insulator (SOI) substrate;

(b) forming a gate electrode and also forming an extended portion that is positioned so as to extend from an end portion of the gate electrode;

(c) using the gate electrode and the extended portion as a mask for the implantation of impurities of a first conductivity type into the SOI substrate, wherein a source region and a drain region of the first conductivity type are formed in such a manner that the body region is interposed between the source region and the drain region; and wherein a first portion of the first conductivity type is formed in the extended portion;

(d) forming a second portion of a second conductivity type connected to the first portion, by implanting impurities of the second conductivity type into the extended portion;

(e) forming an interlayer dielectric to cover the silicon single crystal layer of the SOI substrate;

(f) forming a hole in the interlayer dielectric through which is exposed part of the extended portion and the silicon single crystal layer of the SOI substrate; and (g) electrically connecting the extended portion to the silicon single crystal layer of the SOI substrate by forming a connecting layer within the hole.

According to a third aspect of the present invention, there is provided a method of manufacturing a metal insulator semiconductor (MIS) field-effect transistor of a silicon-on-insulator (SOI) structure, the method comprising the steps of:

(a) forming a body region in a silicon-on-insulator (SOI) substrate;

(b) forming an insulating layer including a gate insulating film on the body region;

(c) forming a hole in the insulating layer through which is exposed part of a silicon single crystal layer of the SOI substrate; and (d) forming a gate electrode and an extended portion on the insulating layer, wherein the extended portion is positioned to extend from an end portion of the gate electrode, and is electrically connected to the silicon single crystal layer of the SOI substrate by the hole;

(e) using the gate electrode and the extended portion as a mask for the implantation of impurities of a first conductivity type into the SOI substrate;

wherein a source region and a drain region of the first conductivity type are formed in such a manner that the body region is interposed between the source region and the drain region; and wherein a first portion of the first conductivity type is formed in the extended portion;

(f) forming a second portion of a second conductivity type connected to the first portion, by implanting impurities of the second conductivity type into the extended portion.

According to a fourth aspect of the present invention, there is provided a method of manufacturing a metal insulator semiconductor (MIS) field-effect transistor of a silicon-on-insulator (SOI) structure, the method comprising the steps of:

(a) forming a body region in a silicon-on-insulator (SOI) substrate;

(b) forming a gate electrode; and (c) using the gate electrode as a mask for the implantation of impurities of a first conductivity type into the SOI substrate, wherein a source region and a drain region of the first conductivity type are formed in such a manner that the body region is interposed between the source region and the drain region; and wherein a first portion of a first conductivity type is formed in a silicon single crystal layer of the SOI substrate;

(d) forming a second portion of a second conductivity type by implanting impurities of the second conductivity type into the silicon single crystal layer of the SOI substrate, wherein the second portion is connected to the first portion, and is positioned between the first portion and the body region;

(e) forming an interlayer dielectric in such a manner as to cover the silicon single crystal layer of the SOI substrate;

(f) forming a first hole in the interlayer dielectric to expose part of the silicon single crystal layer of the SOI substrate and forming a second hole in the interlayer dielectric to expose part of the gate electrode; and (g) forming a wiring layer on the interlayer dielectric, wherein the wiring layer is electrically connected to the silicon single crystal layer of the SOI substrate by the first hole; and wherein the wiring layer is also electrically connected to the gate electrode by the second hole.

DETAILED DESCRIPTION OF THE PREFERRED EMBODIMENTS

First Embodiment (Structure)

Figure 1:
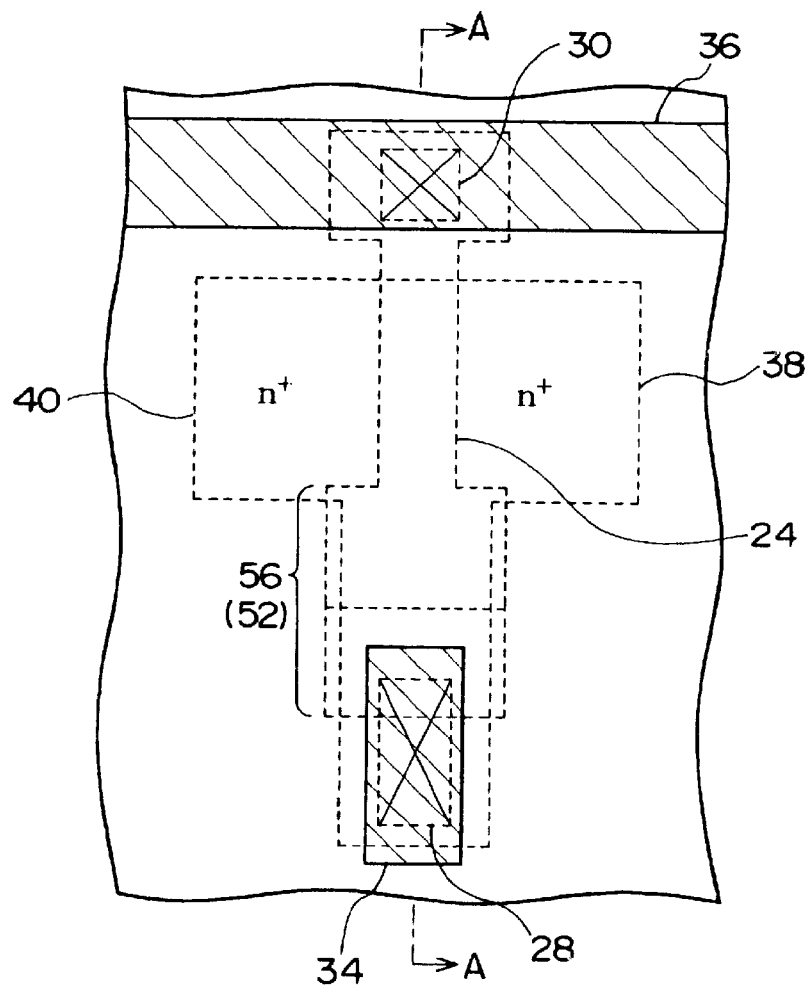
FIG. 1 is a plan view of a MOS field-effect transistor of a SOI structure in accordance with a first embodiment of the present invention.
Figure 2:
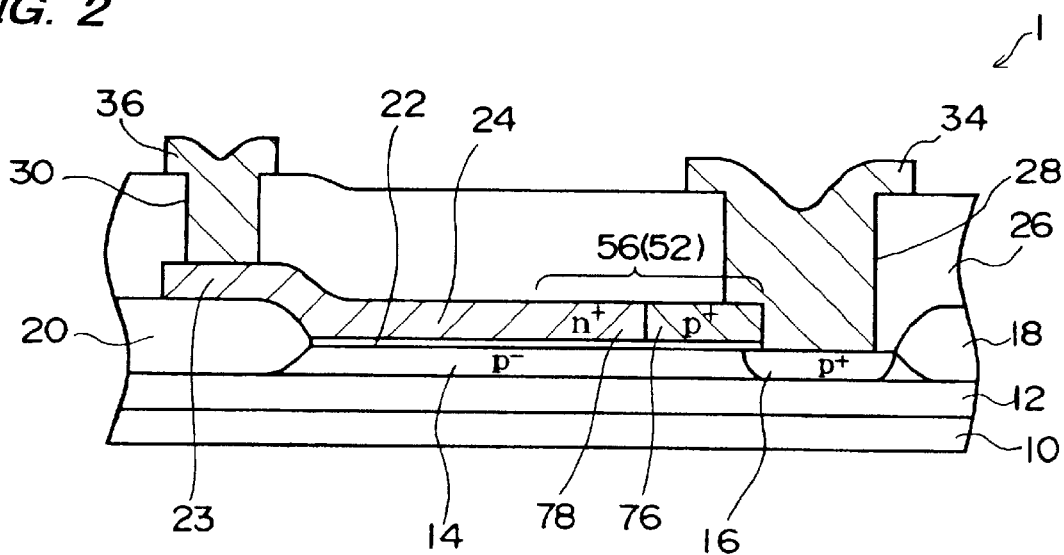
FIG. 2 is a section of the SOI-structure MOS field-effect transistor taken along the line A—A of FIG. 1.

A plan view of a SOI-structure MOS field-effect transistor 1 in accordance with a first embodiment of the present invention is shown in FIG. 1. A section of the MOS field-effect transistor taken along the line A—A of FIG. 1 is shown in FIG. 2. The structure of this MOS field-effect transistor 1 will now be described with reference to FIGS. 1 and 2.

The MOS field-effect transistor 1 is formed on a SOI substrate. The SOI substrate comprises a silicon substrate 10, a buried oxide film 12 formed of a silicon oxide film that is positioned on the silicon substrate 10, and a silicon single crystal layer (which will form components such as a p⁻ region 14).

The MOS field-effect transistor 1 is of an n-channel type and includes a gate electrode 24, the p⁻ region 14 that forms a body region, a drain region 38, and a source region 40.

The p⁻ region 14, the drain region 38, and the source region 40 are formed in the silicon single crystal layer of the SOI substrate. The p⁻ region 14 is sandwiched between the drain region 38 and the source region 40. The p⁻ region 14 is formed in the silicon single crystal layer of the SOI substrate in such a manner that it continues from a p⁺ region 16. The region formed by the p⁺ region 16 and the p⁻ region 14 is sandwiched between two field oxide films 18 and 20 that are formed on the buried oxide film 12.

The gate electrode 24 is formed on the p⁻ region 14 with a gate insulating film 22 therebetween. The gate insulating film 22 is a silicon oxide film, but it could be of another type of insulating film. This applies to other embodiments of the present invention too.

One end portion of the gate electrode 24 is formed integrally with a conductive portion 56. This ensures that one end portion of the gate electrode 24 and the conductive portion 56 can be made electrically conductive. The other end portion of the gate electrode 24 is formed integrally with an conductive portion 23. This ensures that the other end portion of the gate electrode 24 and the conductive portion 23 can be made electrically conductive. The conductive portions 23 and 56 are of the same material as the gate electrode 24 and are formed simultaneously with the gate electrode 24 during the patterning of the gate electrode 24.

The conductive portion 56 is formed so as to extend from one end portion of the gate electrode 24. This conductive portion 56 is cited here as an example of the extended portion. The conductive portion 56 comprises a PN junction portion 52. The PN junction portion 52 consists of a p⁺-type portion 76 and an n⁺-type portion 78. A substance such as polysilicon could be used as the material of the PN junction portion 52. The conductive portion 23, on the other hand, is formed so as to extend from the other end of the gate electrode 24 and rise onto the field oxide film 20.

A silicon oxide film 26 is formed over the SOI substrate. The silicon oxide film 26 is cited here as an example of an interlayer dielectric. Through holes 28 and 30 are formed in the silicon oxide film 26.

The through hole 28 is positioned over the p⁺ region 16 and the p⁺-type portion 76 of the PN junction portion 52. An aluminum layer 34 is provided within the through hole 28. The aluminum layer 34 is cited here as an example of a connecting layer. The p⁺-type portion 76 of the PN junction portion 52 is connected electrically to the p⁺ region 16 by the aluminum layer 34. The n⁺-type portion 78 of the PN junction portion 52 is connected electrically to the gate electrode 24. Since the PN junction portion 52 is disposed as described above, when a positive voltage is applied to the gate electrode, a reverse voltage is applied thereto.

The through hole 30 is positioned over the conductive portion 23. An aluminum wiring layer 36 is formed over the silicon oxide film 26. Gate signals that are to be input to the gate electrode 24 are transferred through the aluminum wiring layer 36. The aluminum wiring layer 36 could be made of a material such as aluminum or an aluminum alloy. The aluminum wiring layer 36 is connected electrically to the conductive portion 23 through the through hole 30.

Figure 3:
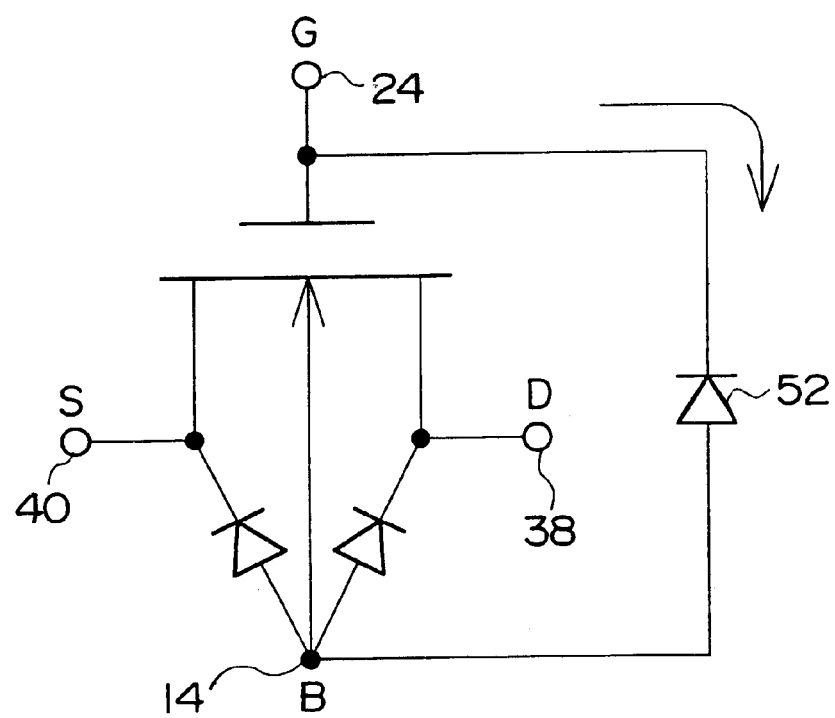
FIG. 3 is an equivalent circuit diagram of the SOI-structure MOS field-effect transistor in accordance with the first embodiment of the present invention.

An equivalent circuit of the SOI-structure MOS field-effect transistor 1 in accordance with the first embodiment of the present invention illustrated in FIGS. 1 and 2 is shown in FIG. 3. Reference number 14 denotes the p⁻ region (body region), 24 denotes the gate electrode, 38 denotes the drain region, 40 denotes the source region, and 52 denotes the PN junction portion.

(Manufacturing Method)

Figure 4:
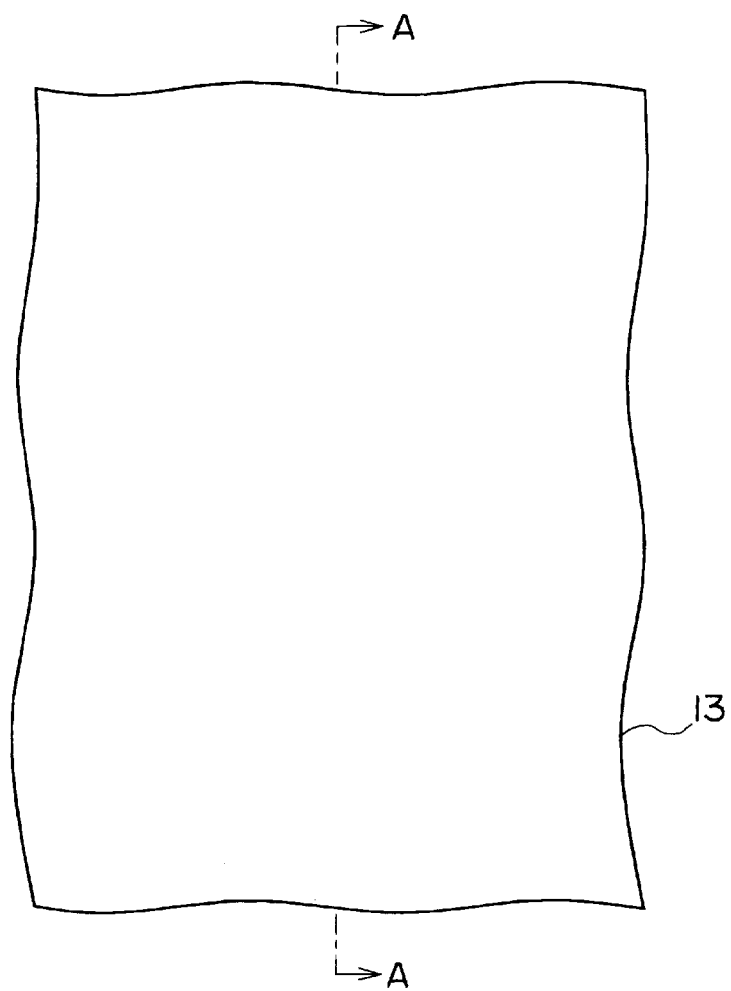
FIG. 4 is a plan view of the SOI substrate, illustrating a first step in the method of manufacturing the SOI-structure MOS field-effect transistor in accordance with the first embodiment of the present invention.
Figure 5:
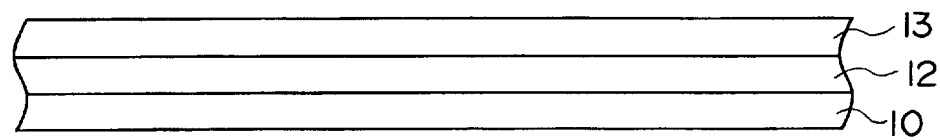
FIG. 5 is a section of the SOI substrate taken along the line A—A of FIG. 4.

The description now turns to an example of the method of manufacturing the MOS field-effect transistor 1. A plan view of the SOI substrate is shown in FIG. 4. FIG. 5 is a section of the SOI substrate taken along the line A—A of FIG. 4. As shown in FIGS. 4 and 5, the SOI substrate comprises the silicon substrate 10, the buried oxide film 12 formed on the silicon substrate 10, and a silicon single crystal layer 13 formed on the buried oxide film 12.

Figure 6:
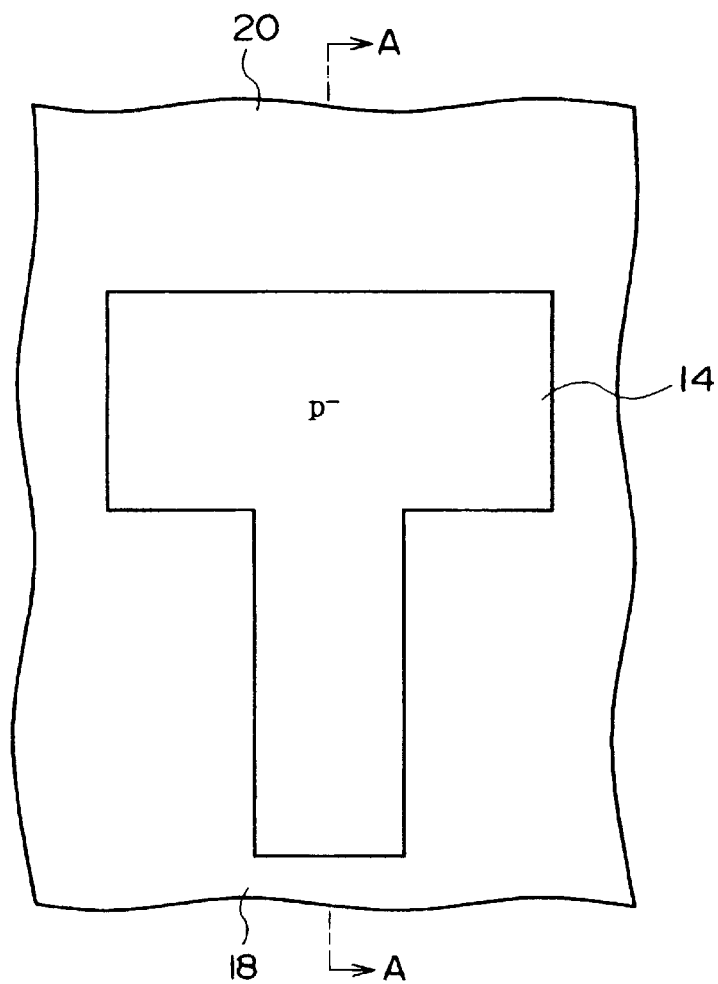
FIG. 6 is a plan view of the SOI substrate, illustrating a second step in the method of manufacturing the SOI-structure MOS field-effect transistor in accordance with the first embodiment of the present invention.
Figure 7:
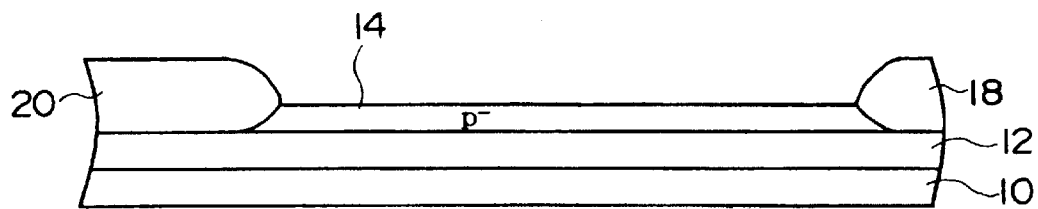
FIG. 7 is a section of the SOI substrate taken along the line A—A of FIG. 6.

The field oxide films 18 and 20 are formed in the silicon single crystal layer 13 by a method such as LOCOS, as shown in FIGS. 6 and 7 (where FIG. 7 is a section of the SOI substrate taken along the line A—A of FIG. 6). The field oxide films 18 and 20 are formed so as to surround the region in which an nMOS field-effect transistor is to be formed. The field oxide films 18 and 20 are then used as a mask for the ion implantation of p-type impurities into the silicon single crystal layer 13, to form the p⁻ region 14 in the region that will become the nMOS field-effect transistor. An element such as boron could be used as the p⁻-type impurities. The ion implantation energy could be 10 keV to 60 keV and the dosage could be $6 \times 10^{12}/\text{cm}^2$ to $6 \times 10^{13}/\text{cm}^2$, by way of example.

Figure 8:
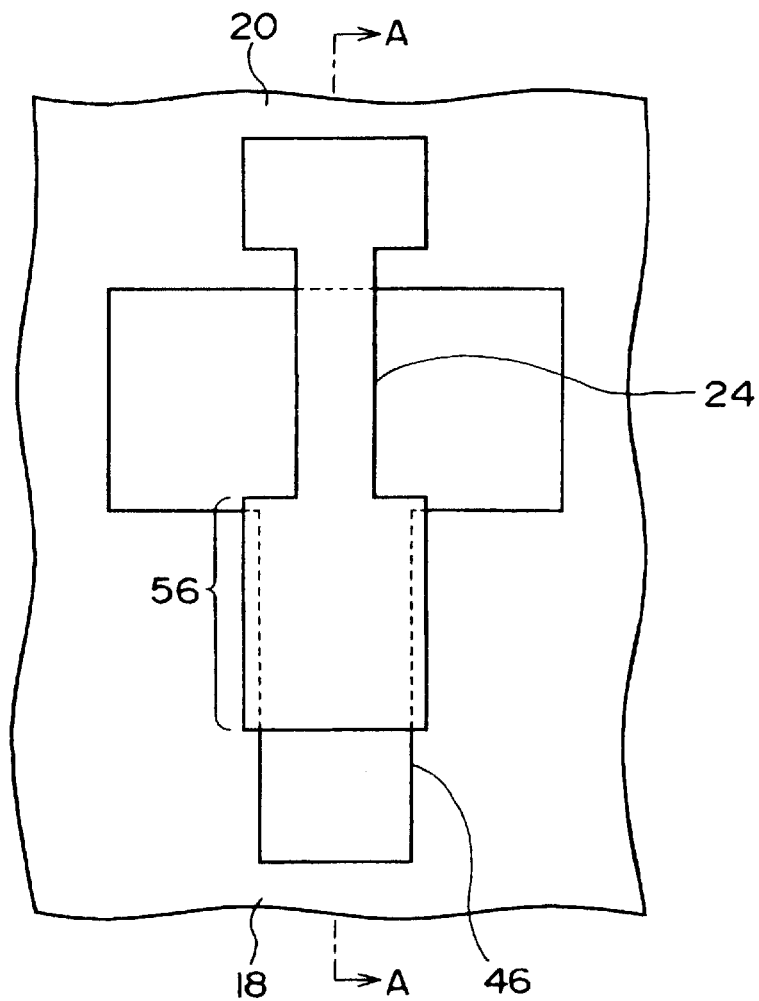
FIG. 8 is a plan view of the SOI substrate, illustrating a third step in the method of manufacturing the SOI-structure MOS field-effect transistor in accordance with the first embodiment of the present invention.
Figure 9:
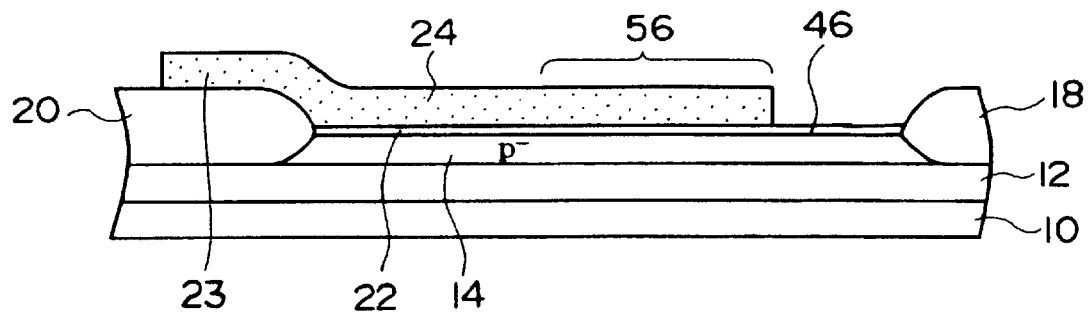
FIG. 9 is a section of the SOI substrate taken along the line A—A of FIG. 8.

A thin oxide film (of thickness 4 nm to 10 nm) that is to form the gate insulating film 22 is then formed by a method such as thermal oxidation on top of the p⁻ region 14, as shown in FIGS. 8 and 9 (where FIG. 9 is a section of the SOI substrate taken along the line A—A of FIG. 8).

A polysilicon film (of thickness 200 nm to 300 nm) that is to form the gate electrode is then formed over the entire surface of the SOI substrate by a method such as CVD.

The polysilicon film is then patterned by photolithography and etching techniques to form the gate electrode 24 and the conductive portions 23 and 56. A region between the conductive portion 56 and the field oxide film 18 becomes a region 46.

Figure 10:
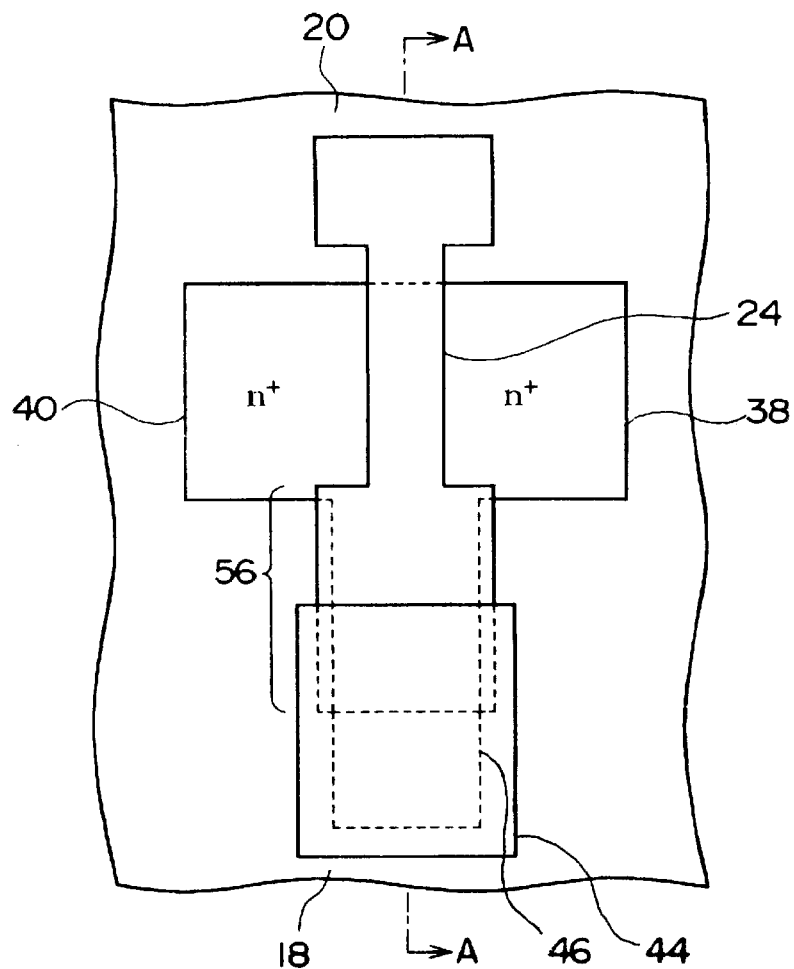
FIG. 10 is a plan view of the SOI substrate, illustrating a fourth step in the method of manufacturing the SOI-structure MOS field-effect transistor in accordance with the first embodiment of the present invention.
Figure 11:
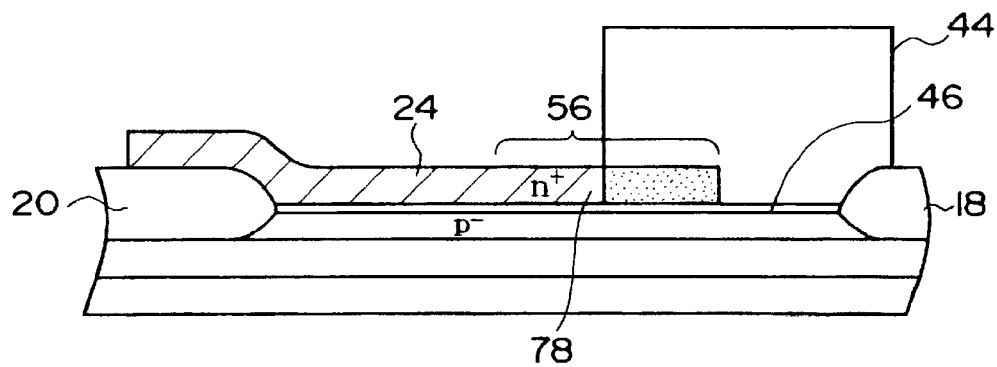
FIG. 11 is a section of the SOI substrate taken along the line A—A of FIG. 10.

A resist layer 44 is formed to cover the region 46 and the part of the conductive portion 56 that is to form a p$^+$-type portion, as shown in FIGS. 10 and 11 (where FIG. 11 is a section of the SOI substrate taken along the line A—A of FIG. 10). The resist layer 44, the gate electrode 24, and the field oxide films 18 and 20 are used as a mask for the ion implantation of n-type ions into the region in which the nMOS field-effect transistor will be formed, to form the source region 40 and the drain region 38. Phosphorous could be used as the n-type ions, the ion implantation energy could be 20 to 50 keV, and the dosage could be 2×10$^{15}$/cm$^2$ to 6×10$^{15}$/cm$^2$, by way of example. This ion implantation process also implants ions into the portion of the conductive portion 56 that is not covered by the resist layer 44. As a result, this portion becomes the n$^+$-type portion 78 of the PN junction portion.

Figure 12:
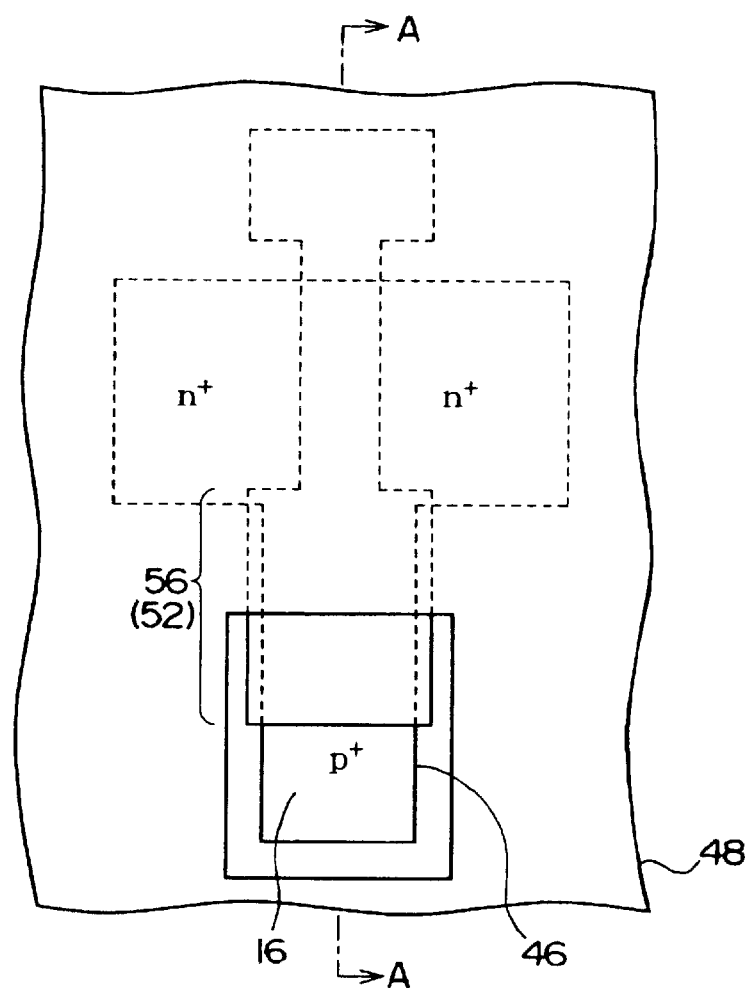
FIG. 12 is a plan view of the SOI substrate, illustrating a fifth step in the method of manufacturing the SOI-structure MOS field-effect transistor in accordance with the first embodiment of the present invention.
Figure 13:
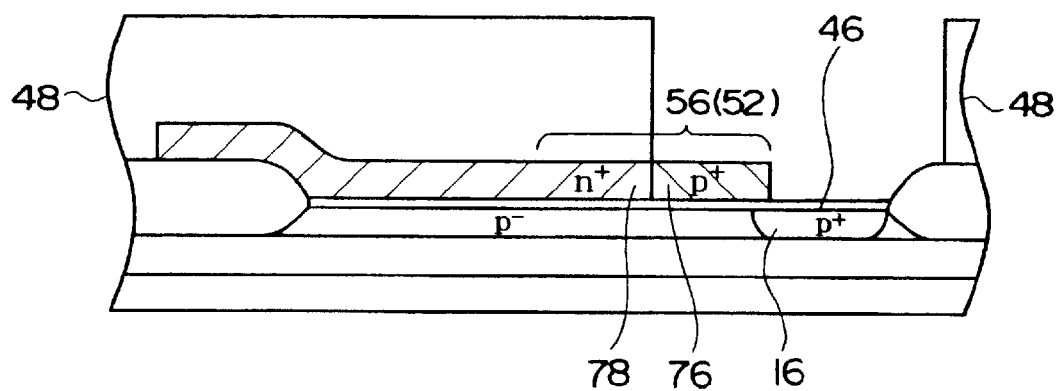
FIG. 13 is a section of the SOI substrate taken along the line A—A of FIG. 12.

A resist layer 48 is formed to expose the region 46 and the part of the conductive portion 56 that is to form the p$^+$-type portion, as shown in FIGS. 12 and 13 (where FIG. 13 is a section of the SOI substrate taken along the line A—A of FIG. 12). The resist layer 48 is used as a mask for the ion implantation of p-type ions into the region 46 and the conductive portion 56. The part of the conductive portion 56 that is on the region 46 side will become the p$^+$-type portion 76 of the PN junction portion. This forms the p$^+$ region 16 in the region 46. Boron could be used as the p-type ions, the ion implantation energy could be 10 to 30 keV, and the dosage could be 2×10$^{15}$ to 6×10$^{15}$/cm$^2$, by way of example.

Figure 14:
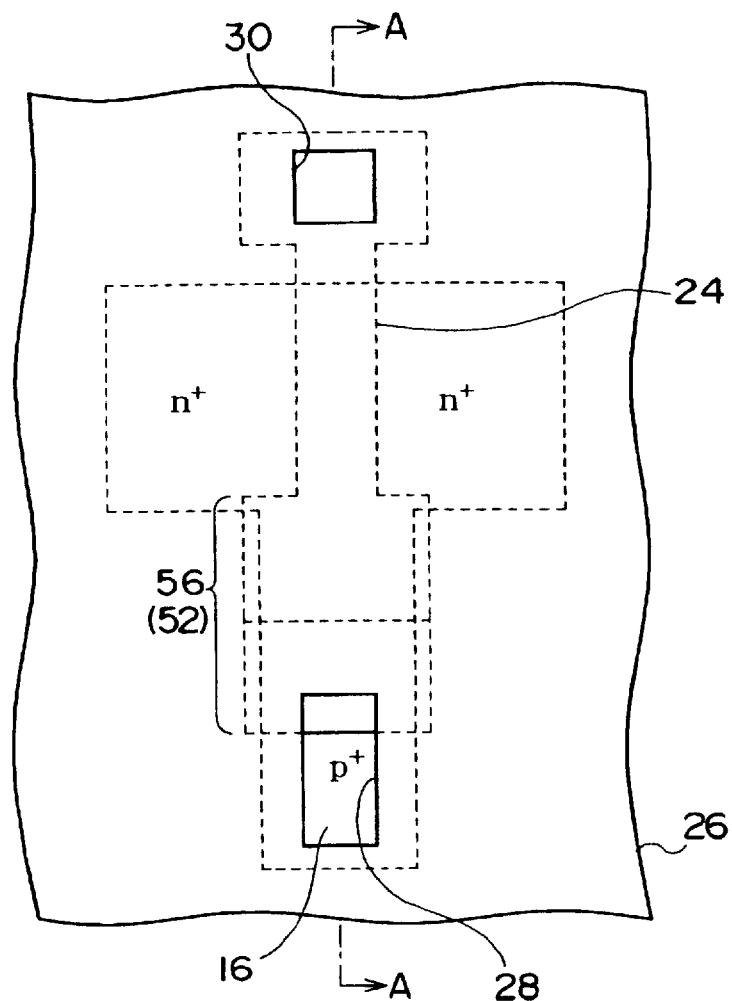
FIG. 14 is a plan view of the SOI substrate, illustrating a sixth step in the method of manufacturing the SOI-structure MOS field-effect transistor in accordance with the first embodiment of the present invention.
Figure 15:
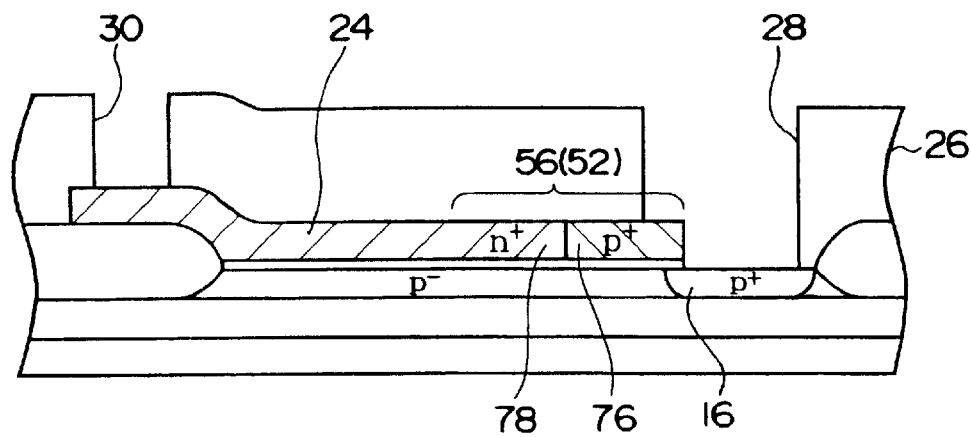
FIG. 15 is a section of the SOI substrate taken along the line A—A of FIG. 14.

The silicon oxide film 26 (of thickness 500 nm to 800 nm) is then formed over the entire surface of the SOI substrate by a method such as CVD, as shown in FIGS. 14 and 15 (where FIG. 15 is a section of the SOI substrate taken along the line A—A of FIG. 14).

The silicon oxide film 26 is selectively removed by photolithography and etching techniques to form the through hole 28 and the through hole 30. The through hole 28 exposes the p$^+$ region 16 and the through hole 30 exposes the conductive portion 23.

An aluminum film (of thickness 500 nm to 800 nm) is formed over the entire surface of the SOI substrate by a method such as sputtering, as shown in FIGS. 1 and 2. The aluminum film is patterned by photolithography and etching techniques to form the aluminum layer 34 and the aluminum wiring layer 36. This completes the SOI-structure MOS field-effect transistor 1.

The above description related to an nMOS configuration. The above described method could also be used for a pMOS configuration, by reversing all the conductivity types.
(Effects)

The main effects of the SOI-structure MOS field-effect transistor 1 will now be described.

As shown in FIGS. 1 and 2, in the SOI-structure MOS field-effect transistor 1, the gate electrode 24 and the p$^-$ region 14 that is the body region are placed into electrical contact by the PN junction portion 52. The n$^+$-type portion 78 of the PN junction portion 52 is connected electrically to the gate electrode 24 and the p$^+$-type portion 76 of the PN junction portion 52 is connected electrically to the p$^+$ region 16. The effects achieved by this configuration will now be described with reference to FIG. 3.

As shown in FIG. 3, there is a path from the gate electrode 24, through the PN junction portion 52 and the body region, and into the source region 40. If a positive voltage is applied to the gate electrode 24, a reverse voltage is applied to the PN junction portion 52 so that only a small current on the order of the reverse leakage current of the PN junction flows along that path. This ensures that the power consumption of the SOI-structure MIS field-effect transistor can be restrained, even when it is used under conditions of a comparatively high gate voltage.

This effect is the same with other embodiments of the invention.

In the MOS field-effect transistor 1, the PN junction portion 52 is positioned between the gate electrode 24 and the body region. For that reason, it is possible to apply a desired signal voltage to the gate electrode 24 even when the current is suppressed by the PN junction portion 52. Specifically, the signal voltage is applied from the aluminum wiring layer 36, through the gate electrode 24 and the conductive portion 56, and then into the body region. If the PN junction portion 52 were between the conductive portion 23 and the gate electrode 24, the current suppression effect of the PN junction portion 52 might make it impossible to apply the desired voltage to the gate electrode 24. With the SOI-structure MOS field-effect transistor 1, however, it is possible to prevent this.

This effect is the same for other embodiments of the invention.

Second Embodiment
(Structure)

Figure 16:
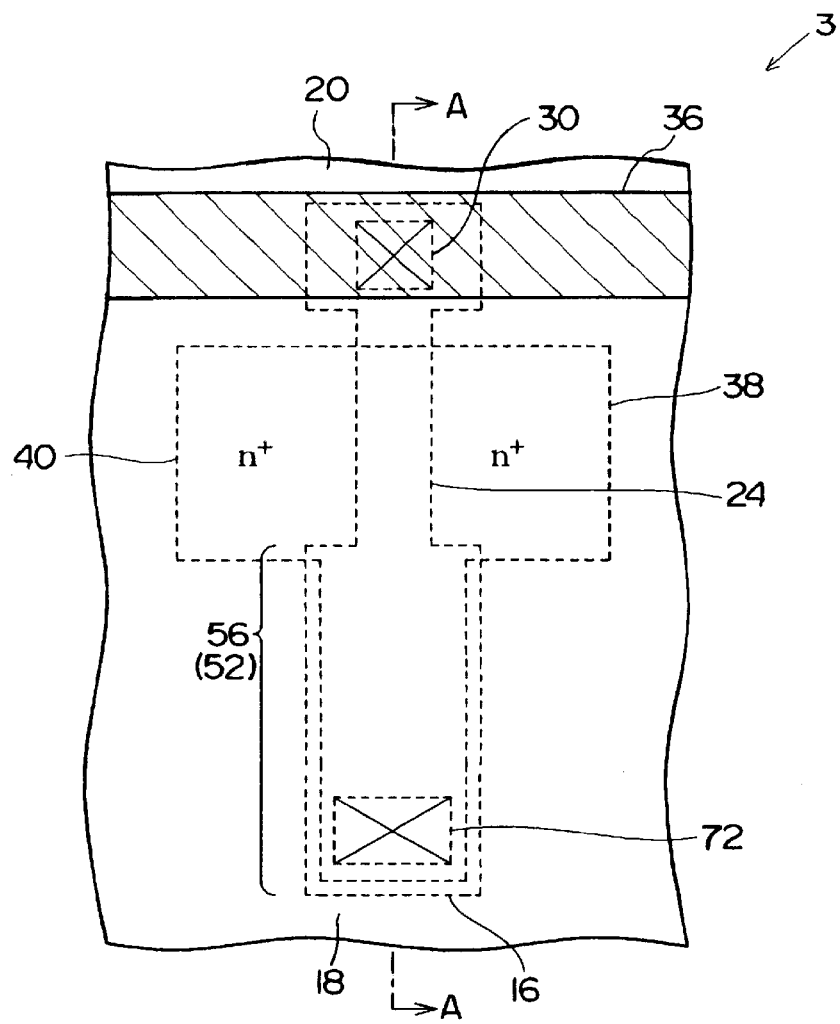
FIG. 16 shows a plan view of a SOI-structure MOS field-effect transistor in accordance with a second embodiment of the present invention.
Figure 17:
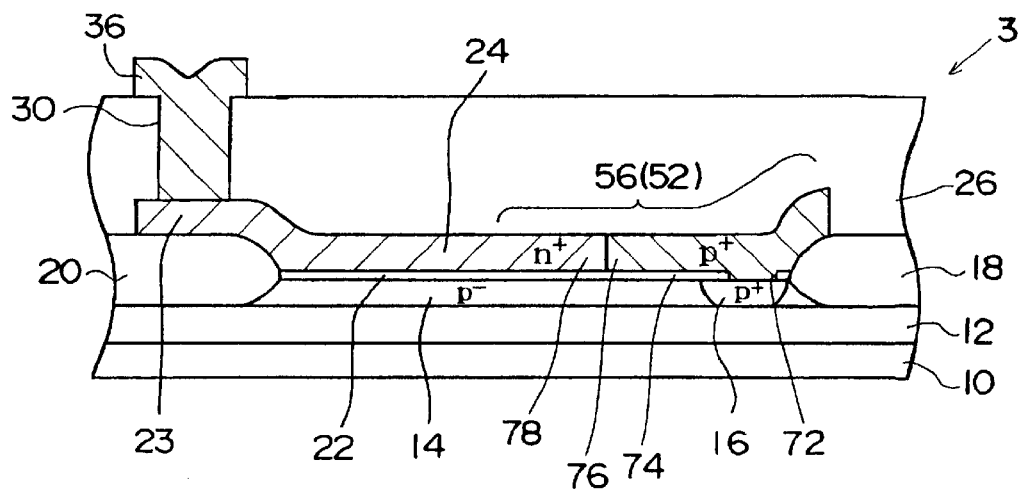
FIG. 17 is a section of the SOI-structure MOS field-effect transistor taken along the line A—A of FIG. 16.

A plan view of a SOI-structure MOS field-effect transistor 3 in accordance with a second embodiment of the present invention is shown in FIG. 16. A section of the SOI-structure MOS field-effect transistor 3 taken along the line A—A of FIG. 16 is shown in FIG. 17. The description below mainly concentrates on how this transistor differs from the SOI-structure MOS field-effect transistor 1 of the first embodiment, shown in FIGS. 1 and 2. Components that are the same as those of the first embodiment are given the same reference numbers and further description thereof is omitted.

In the SOI-structure MOS field-effect transistor 3, the conductive portion 56 extends over the field oxide film 18. An insulating film 74 is positioned between the conductive portion 56 and the p$^+$ region 16. The insulating film 74 is a film that is formed when the gate insulating film 22 is formed. A hole 72 is formed in the insulating film 74 on the p$^+$ region 16. The conductive portion 56 is connected electrically to the p$^+$ region 16 by the hole 72.
(Manufacturing Method)

The steps shown in FIG. 4 (FIG. 5) and FIG. 6 (FIG. 7) are first performed, using methods similar to those of the first embodiment.

Figure 18:
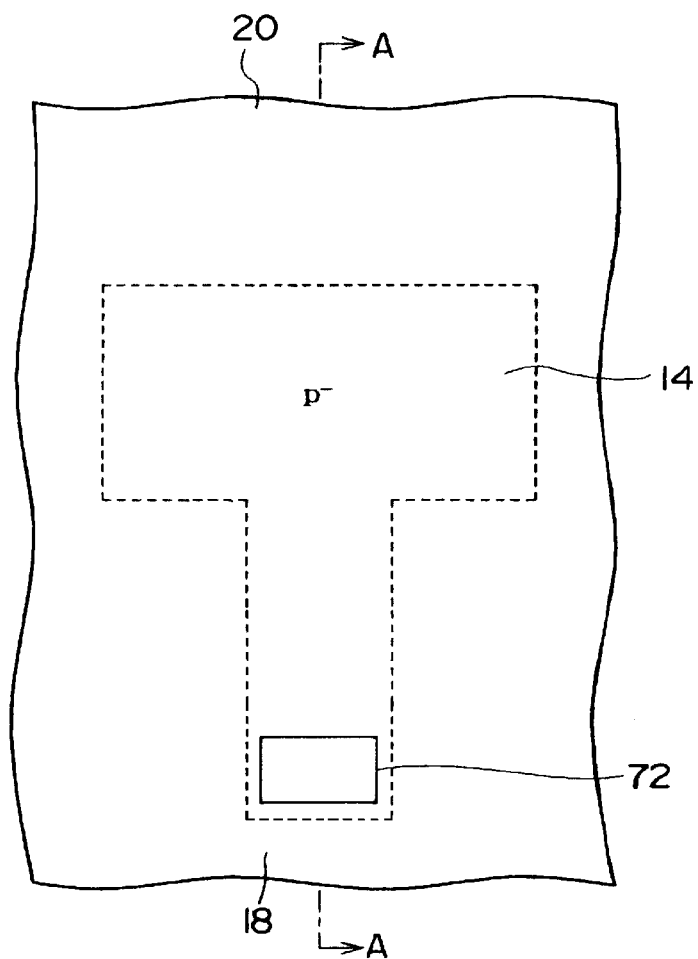
FIG. 18 is a plan view of the SOI substrate, illustrating a first step in the method of manufacturing the SOI-structure MOS field-effect transistor in accordance with the second embodiment of the present invention.
Figure 19:
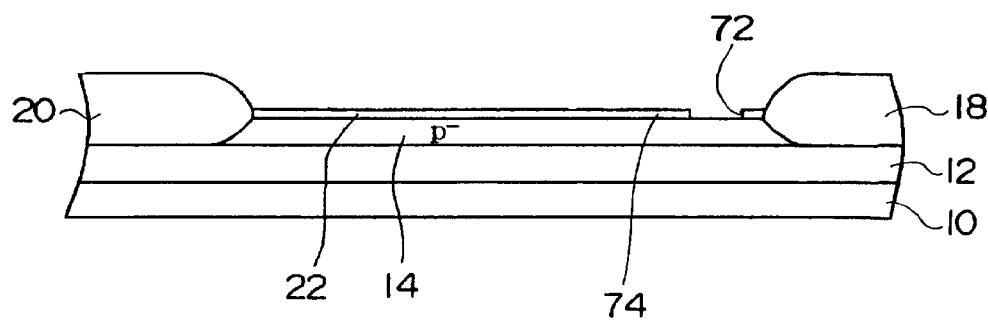
FIG. 19 a section of the SOI substrate taken along the line A—A of FIG. 18.

After the step shown in FIG. 6 (FIG. 7), the gate insulating film 22 and the insulating film 74 are formed on the p$^-$ region 14, using methods similar to those of the first embodiment, as shown in FIGS. 18 and 19 (where FIG. 19 is a section of the SOI substrate taken along the line A—A of FIG. 18). The hole 72 is formed in the insulating film 74 by photolithography and etching techniques.

Figure 20:
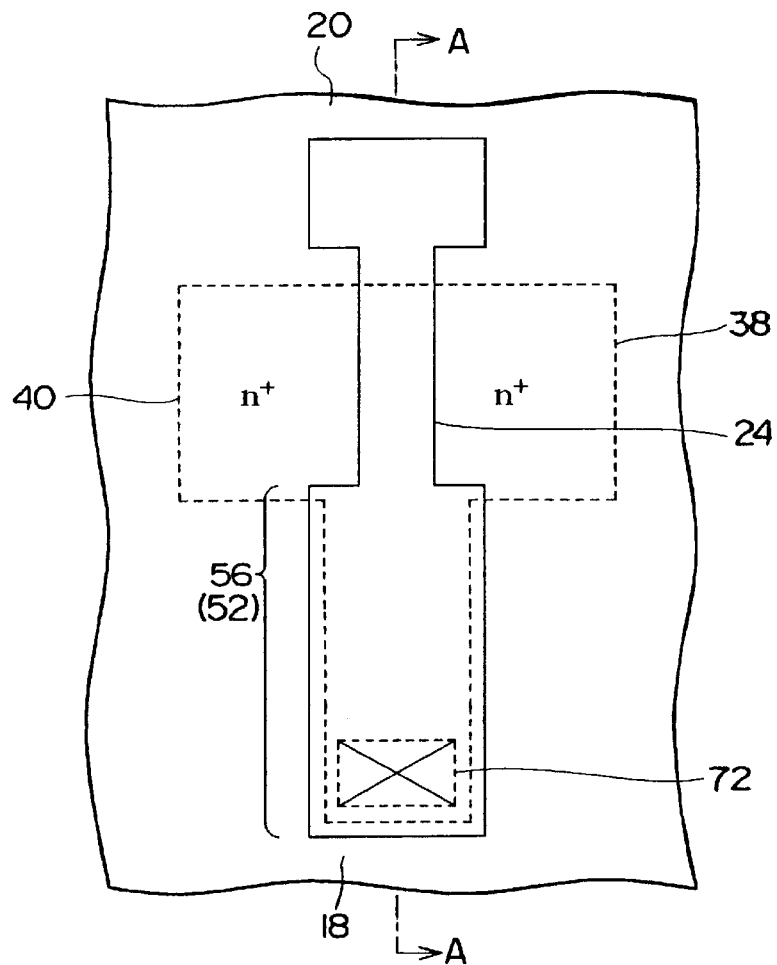
FIG. 20 is a plan view of the SOI substrate, illustrating a second step in the method of manufacturing the SOI-structure MOS field-effect transistor in accordance with the second embodiment of the present invention.
Figure 21:
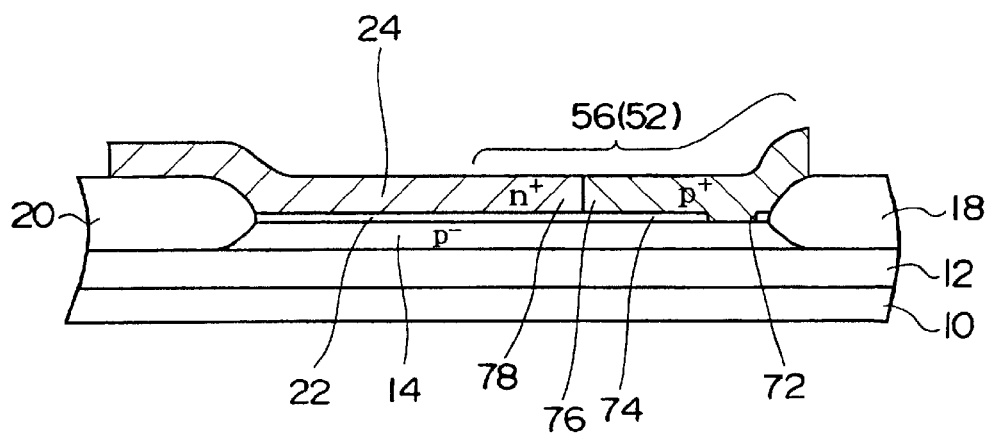
FIG. 21 is a section of the SOI substrate taken along the line A—A of FIG. 20.

As shown in FIGS. 20 and 21 (where FIG. 21 is a section of the SOI substrate taken along the line A—A of FIG. 20), n-type ions and p-type ions are implanted by a method similar to that of the first embodiment. This forms the drain region 38, the source region 40, and the PN junction portion 52.

Figure 22:
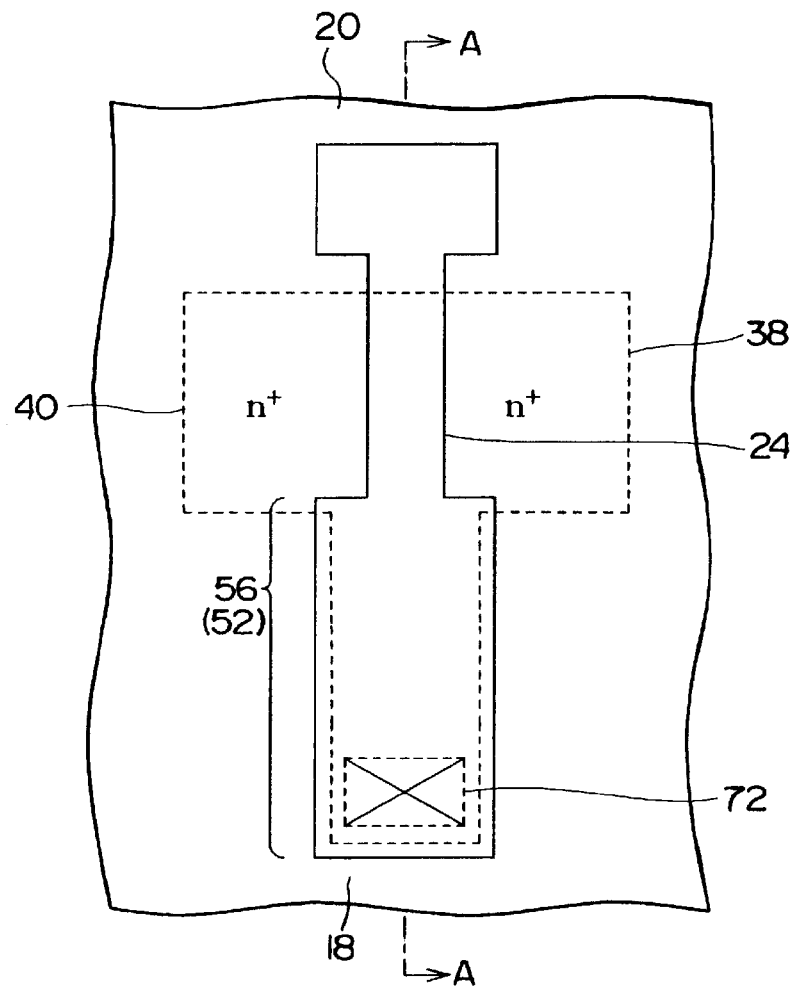
FIG. 22 is a plan view of the SOI substrate, illustrating a third step in the method of manufacturing the SOI-structure MOS field-effect transistor in accordance with the second embodiment of the present invention.
Figure 23:
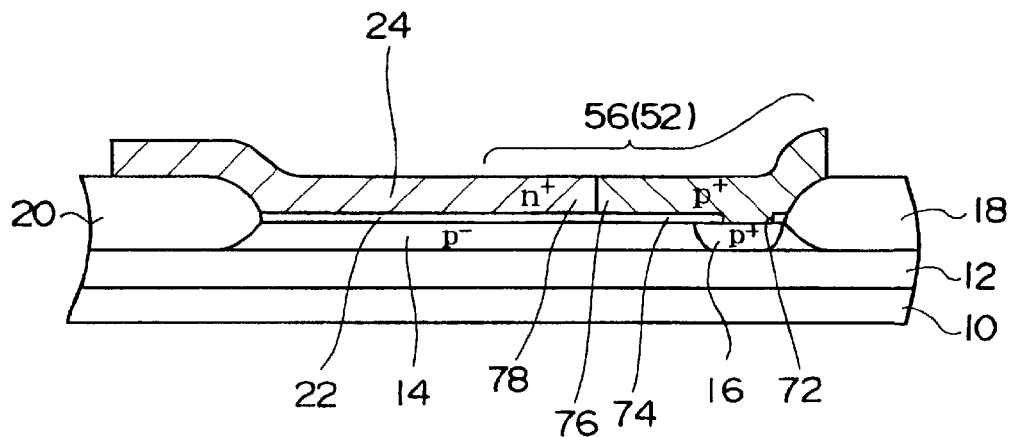
FIG. 23 is a section of the SOI substrate taken along the line A—A of FIG. 22.

The p-type impurities within the p$^+$-type portion 76 of the PN junction portion 52 are diffused through the hole 72 into the p$^-$ region 14 during thermal processing that is performed subsequently, to form the p$^+$ region 16 under the hole 72, as shown in FIGS. 22 and 23 (where FIG. 23 is a of the SOI substrate section taken along the line A—A of FIG. 22).

Subsequent steps are the same as those of the first embodiment. This completes the SOI-structure MOS field-effect transistor 3.

Third Embodiment (Structure)

Figure 24:
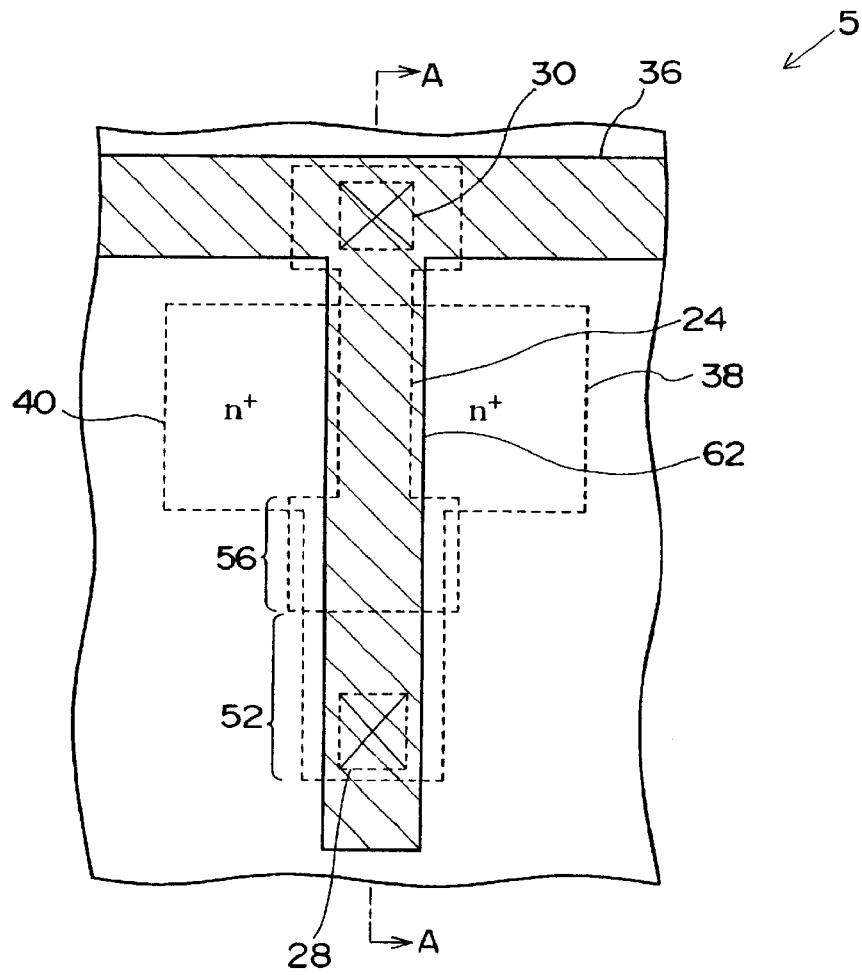
FIG. 24 is a plan view of a SOI-structure MOS field-effect transistor in accordance with a third embodiment of the present invention.
Figure 25:
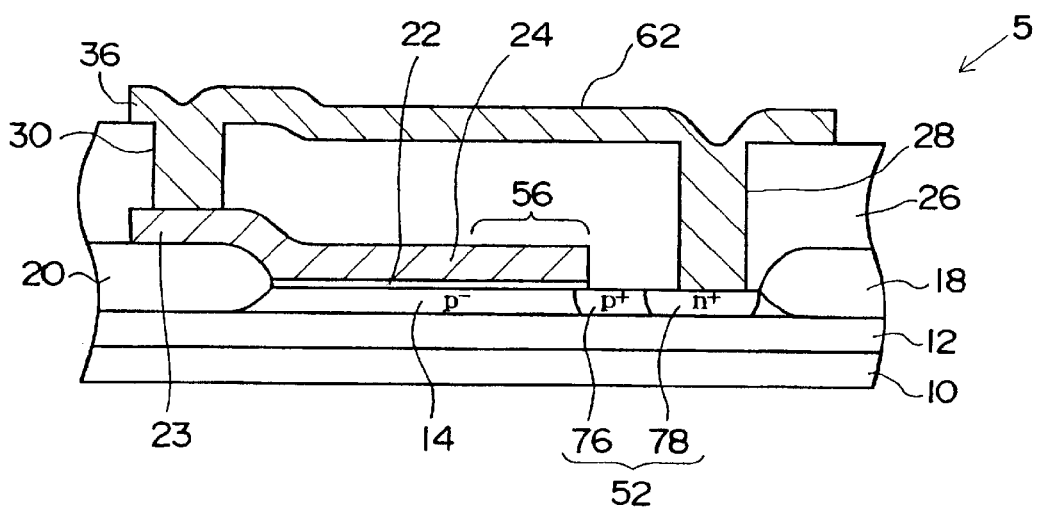
FIG. 25 is a section of the SOI-structure MOS field-effect transistor taken along the line A—A of FIG. 24.

A plan view of a SOI-structure MOS field-effect transistor 5 in accordance with a third embodiment of the present invention is shown in FIG. 24. A section of the SOI-structure MOS field-effect transistor 5 taken along the line A—A of FIG. 24 is shown in FIG. 25. The description below mainly concentrates on how this transistor differs from the SOI-structure MOS field-effect transistor 1 of the first embodiment, shown in FIGS. 1 and 2. Components that are the same as those of the first embodiment are given the same reference numbers and further description thereof is omitted.

The first difference from the SOI-structure MOS field-effect transistor 1 concerns the structure of the PN junction portion 52. In other words, the PN junction portion 52 of the MOS field-effect transistor 5 is formed within a silicon single crystal layer of the SOI substrate. The PN junction portion 52 consists of the p$^+$-type portion 76 and the n$^+$-type portion 78. The p$^+$-type portion 76 is on the p$^-$ region 14 side.

The conductive portion 56 is not used to provide electrical contact between the gate electrode 24 and the impurity region (the n$^+$-type portion 78). The reasons therefor are discussed below. To ensure that the p$^+$-type portion 76 and the n$^+$-type portion 78 function as the PN junction portion 52, it is necessary to ensure that the conductive portion 56 is connected electrically to the n$^+$-type portion 78 without being connected electrically to the p$^+$-type portion 76. However, the conductive portion 56 is inevitably in contact with the p$^+$-type portion 76, so that the conductive portion 56 cannot be used for electrical contact between the gate electrode 24 and the n$^+$-type portion 78.

The configuration described below is used to ensure that the p$^+$-type portion 76 and the n$^+$-type portion 78 function as the PN junction portion 52. An aluminum wiring layer 62 is formed on the silicon oxide film 26. The aluminum wiring layer 62 is of the same material as the aluminum wiring layer 36. One end portion of the aluminum wiring layer 62 is placed in electrical contact with the n$^+$-type portion 78 by the through hole 28. The other end portion of the aluminum wiring layer 62 is place in electrical contact with the aluminum wiring layer 36.

(Manufacturing Method)

The steps shown in FIG. 4 (FIG. 5) to FIG. 8 (FIG. 9) are first performed. The steps up to this point in the method of manufacturing the SOI-structure MOS field-effect transistor 5 are the same as the steps in the method of manufacturing the SOI-structure MOS field-effect transistor 1. However, the conductive portion 56 in this case is shorter than the conductive portion 56 in the first embodiment. In the third embodiment, the PN junction portion 52 is not formed in the conductive portion 56.

Figure 26:
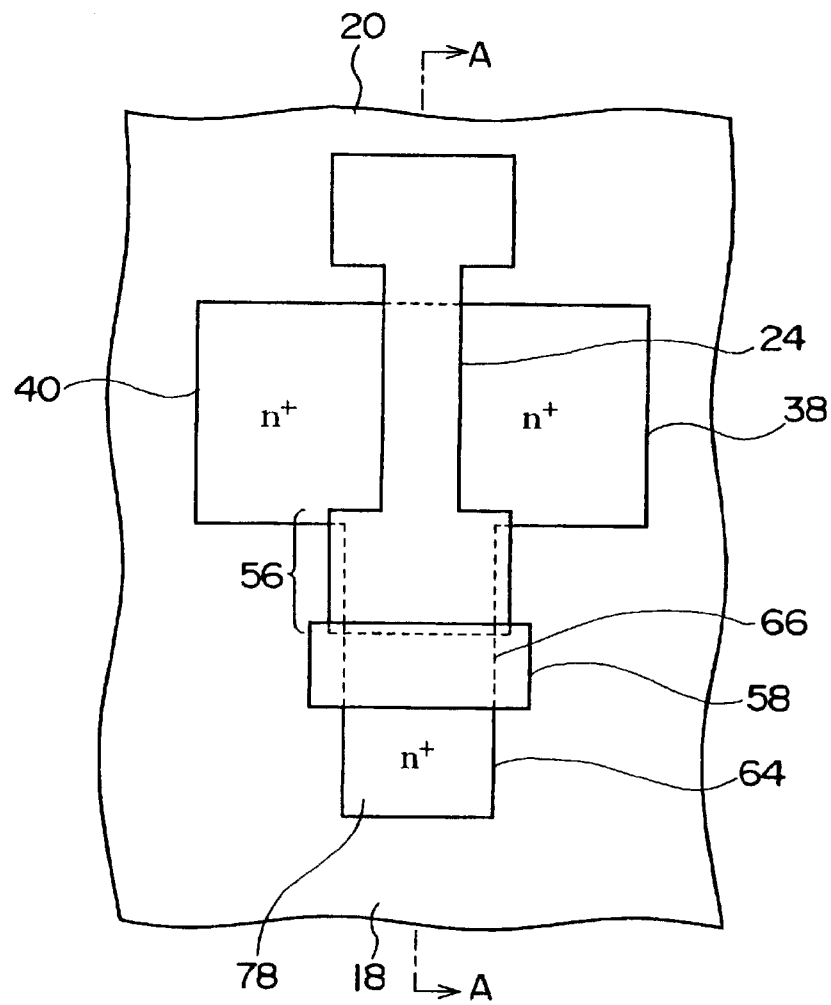
FIG. 26 is a plan view of the SOI substrate, illustrating a first step in the method of manufacturing the SOI-structure MOS field-effect transistor in accordance with the third embodiment of the present invention.
Figure 27:
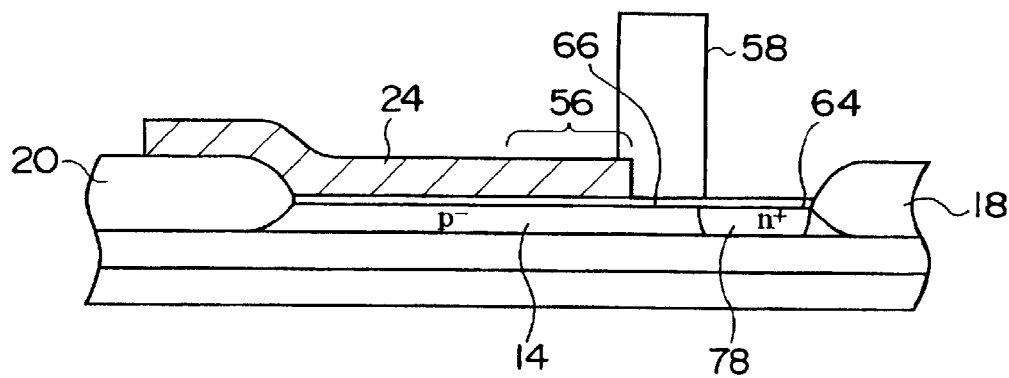
FIG. 27 is a section of the SOI substrate taken along the line A—A of FIG. 26.

After the step shown in FIG. 8 (FIG. 9), part of the p$^-$ region 14 is exposed between the conductive portion 56 and the field oxide film 18, as shown in FIGS. 26 and 27 (where FIG. 27 is a section of the SOI substrate taken along the line A—A of FIG. 26). This exposed region forms regions 64 and 66. The region 64 and the region 66 are adjacent. The region 66 is on the conductive portion 56 side.

A resist layer 58 is formed over the region 66. The resist layer 58, the gate electrode 24, and the field oxide films 18 and 20 are used as a mask for the ion implantation of n-type ions into the region in which the nMOS field-effect transistor will be formed, to form the source region 40 and the drain region 38. The conditions for ion implantation are the same as those of the first embodiment. This ion implantation ensures that ions are also implanted into a region 64. As a result, this portion become the n$^+$-type portion 78.

Figure 28:
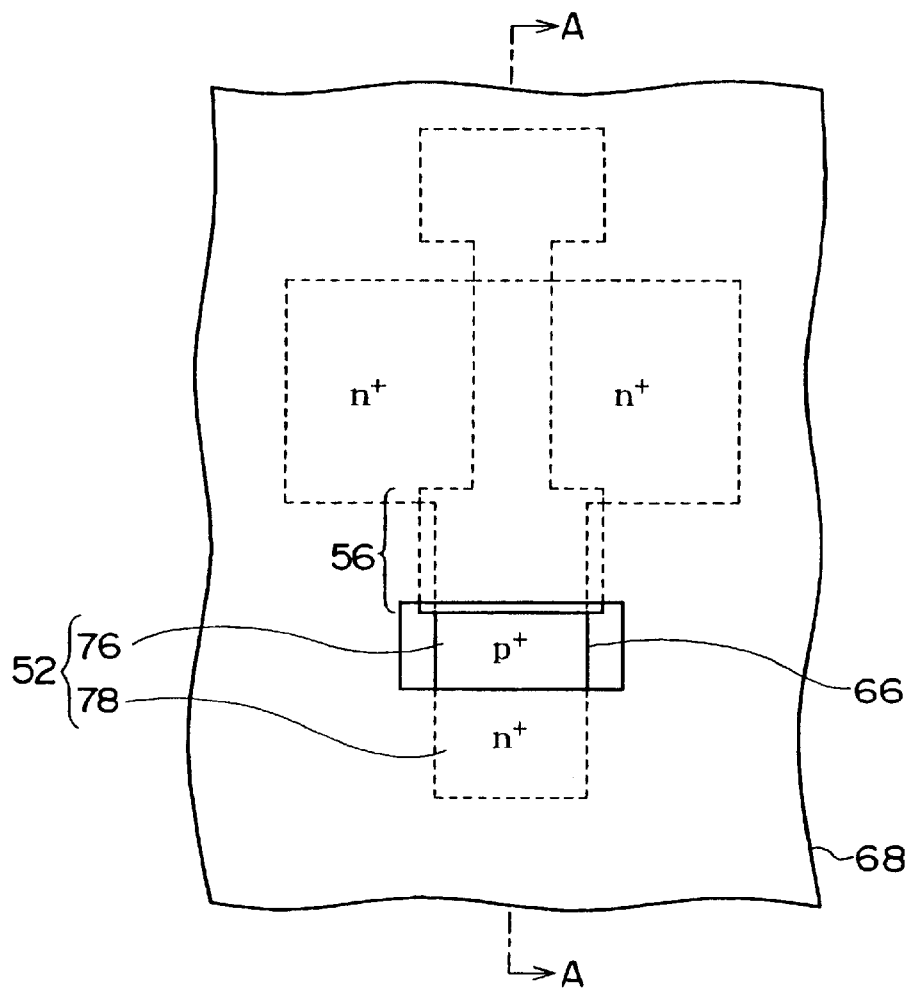
FIG. 28 is a plan view of the SOI substrate, illustrating a second step in the method of manufacturing the SOI-structure MOS field-effect transistor in accordance with the third embodiment of the present invention.
Figure 29:
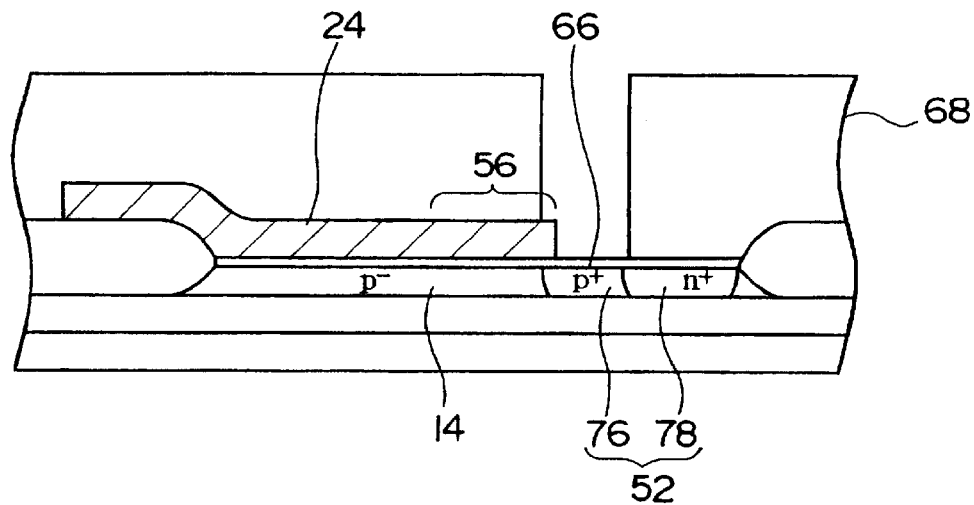
FIG. 29 is a section of the SOI substrate taken along the line A—A of FIG. 28.

A resist layer 68 is formed to expose the region 66, as shown in FIGS. 28 and 29 (where FIG. 29 is a section taken along the line A—A through the structure of the SOI substrate of FIG. 29). The resist layer 68 is used as a mask for the ion implantation of p-type ions into the region 66. This forms the p$^+$-type portion 76 in the region 66. The conditions for ion implantation are the same as those of the first embodiment.

Figure 30:
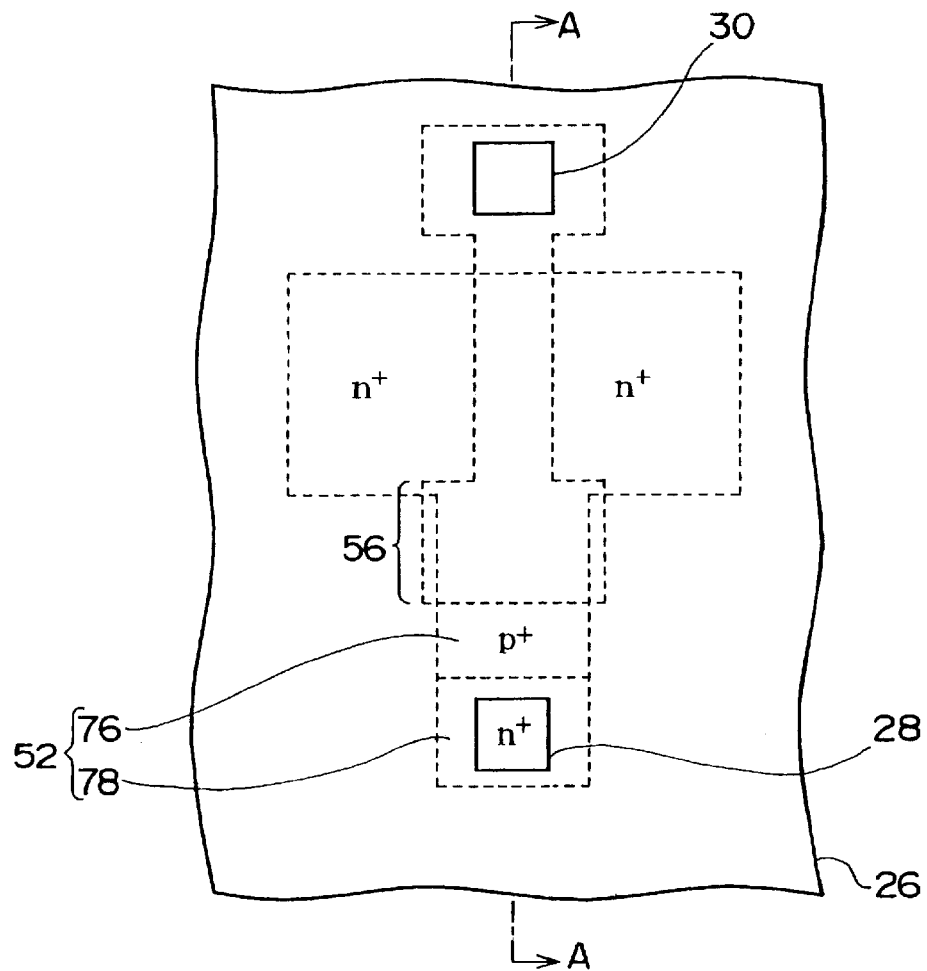
FIG. 30 is a plan view of the SOI substrate, illustrating a third step in the method of manufacturing the SOI-structure MOS field-effect transistor in accordance with the third embodiment of the present invention.
Figure 31:
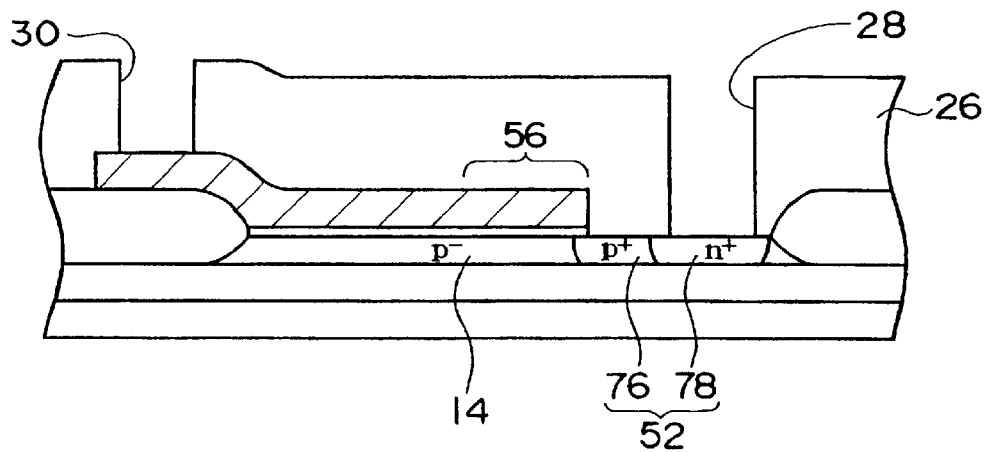
FIG. 31 is a section of the SOI substrate taken along the line A—A of FIG. 30.

The steps shown in FIGS. 30 and 31 (where FIG. 31 is a section of the SOI substrate taken along the line A—A of FIG. 30) are then performed. These steps are the same as those shown in FIGS. 14 and 15. However, the portion that is exposed by the through hole 28 in this case is the n$^+$-type portion 78.

The aluminum wiring layers 36 and 62 are then formed by a method similar to that of the first embodiment, as shown in FIGS. 24 and 25. This completes the SOI-structure MOS field-effect transistor 5 in accordance with the third embodiment of this invention.

Note that the descriptions of the first to third embodiments of this invention related to the n-channel type of MOS field-effect transistor but it should be obvious that the effects of the present invention can also be obtained with the p-channel type of MOS field-effect transistor. In such a case, a p-type semiconductor portion of the PN junction corresponds to the n$^+$-type portion 78 and an n-type semiconductor portion thereof corresponds to the p$^+$-type portion 76.

Experimental Examples

Figure 32:
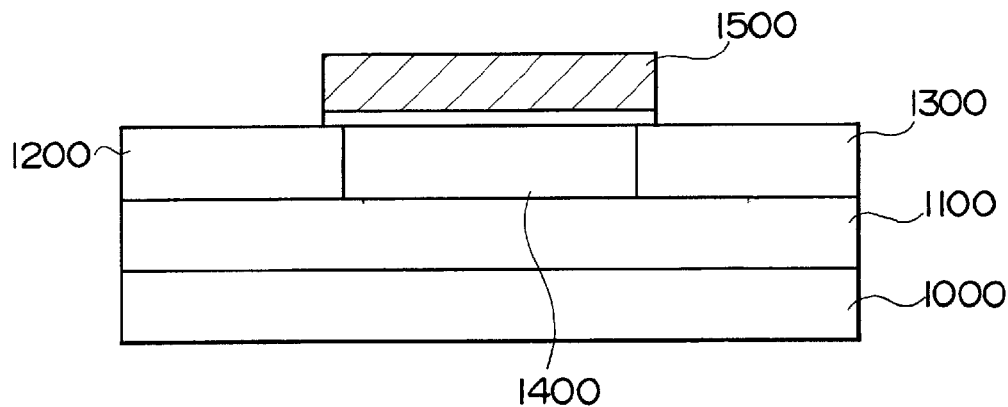
FIG. 32 is a schematic view of an example of a conventional SOI-structure MOS field-effect transistor.
Figure 33:
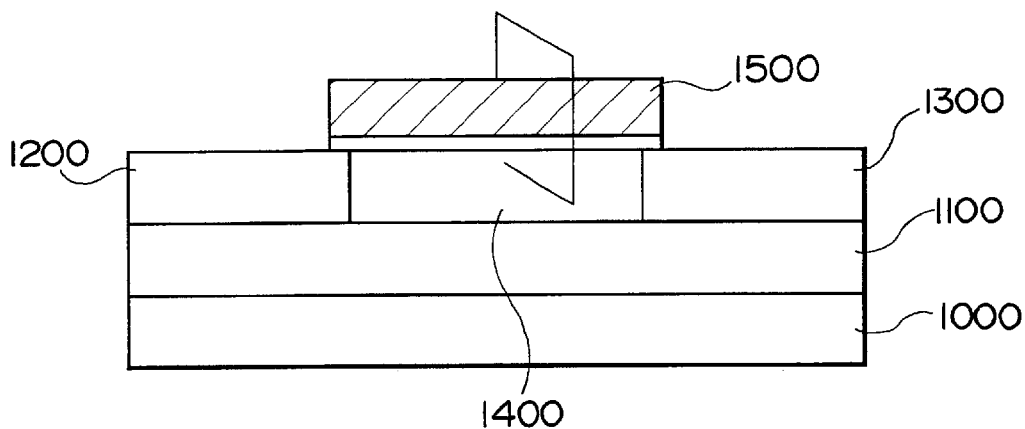
FIG. 33 is a schematic view of another example of a conventional SOI-structure MOS field-effect transistor.
Figure 34:
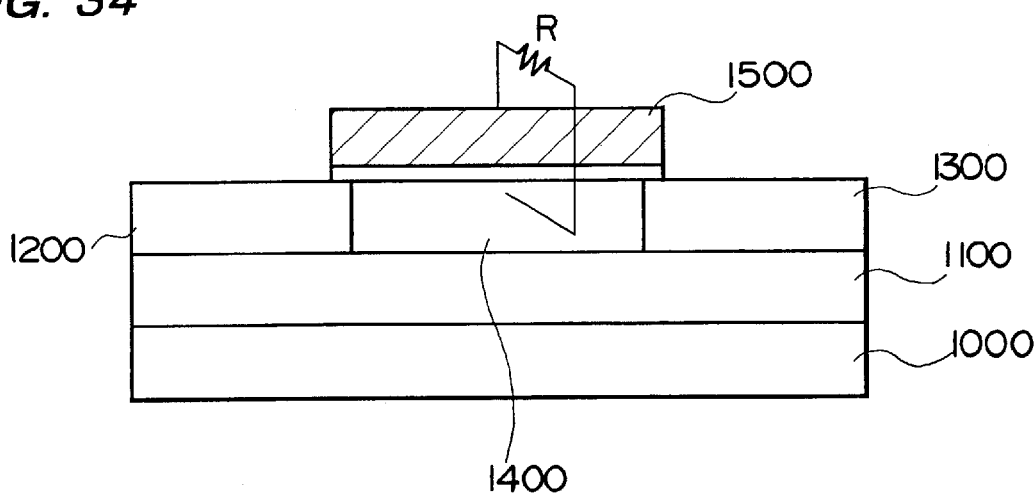
FIG. 34 is a schematic view of a SOI-structure MOS field-effect transistor in accordance with an embodiment of the present invention.

The effects produced by the provision of a resistance portion R will now be described with reference to experimental examples, together with the characteristics of a DTMOS. The resistance portion R described below was made of polysilicon. On the other hand, the PN junction portion of the present invention was made to function as the resistance portion R. Since either configuration can function as a resistor, it can be assumed that the present invention can achieve effects that are similar to those of these experimental examples. A schematic view of a conventional SOI-structure MOS field-effect transistor is shown in FIG. 32. This configuration has been described already in the Background of the Invention and is hereinafter called a floating-body type of field-effect transistor. A schematic view of another conventional SOI-structure MOS field-effect transistor is shown in FIG. 33. This configuration has been described already in the Background of the Invention and is hereinafter called a DTMOS type of field-effect transistor. A schematic view of a SOI-structure MOS field-effect transistor according to an embodiment of the present invention is shown in FIG. 34. The configuration of FIG. 34 differs from that of FIG. 33 in that the configuration of FIG. 34 is provided with the resistance portion R. This is a DTMOS type of field-effect transistor in accordance with an embodiment of the present invention.

These MOS field-effect transistors have two operating modes: fully depleted and partially depleted. In general, a fully depleted transistor has a body region that is thinner than that of a partially depleted transistor. Thus the entire body region becomes a depletion layer. In contrast thereto, a base portion of the body region of a partially depleted transistor is not a depletion layer.

Figure 35:
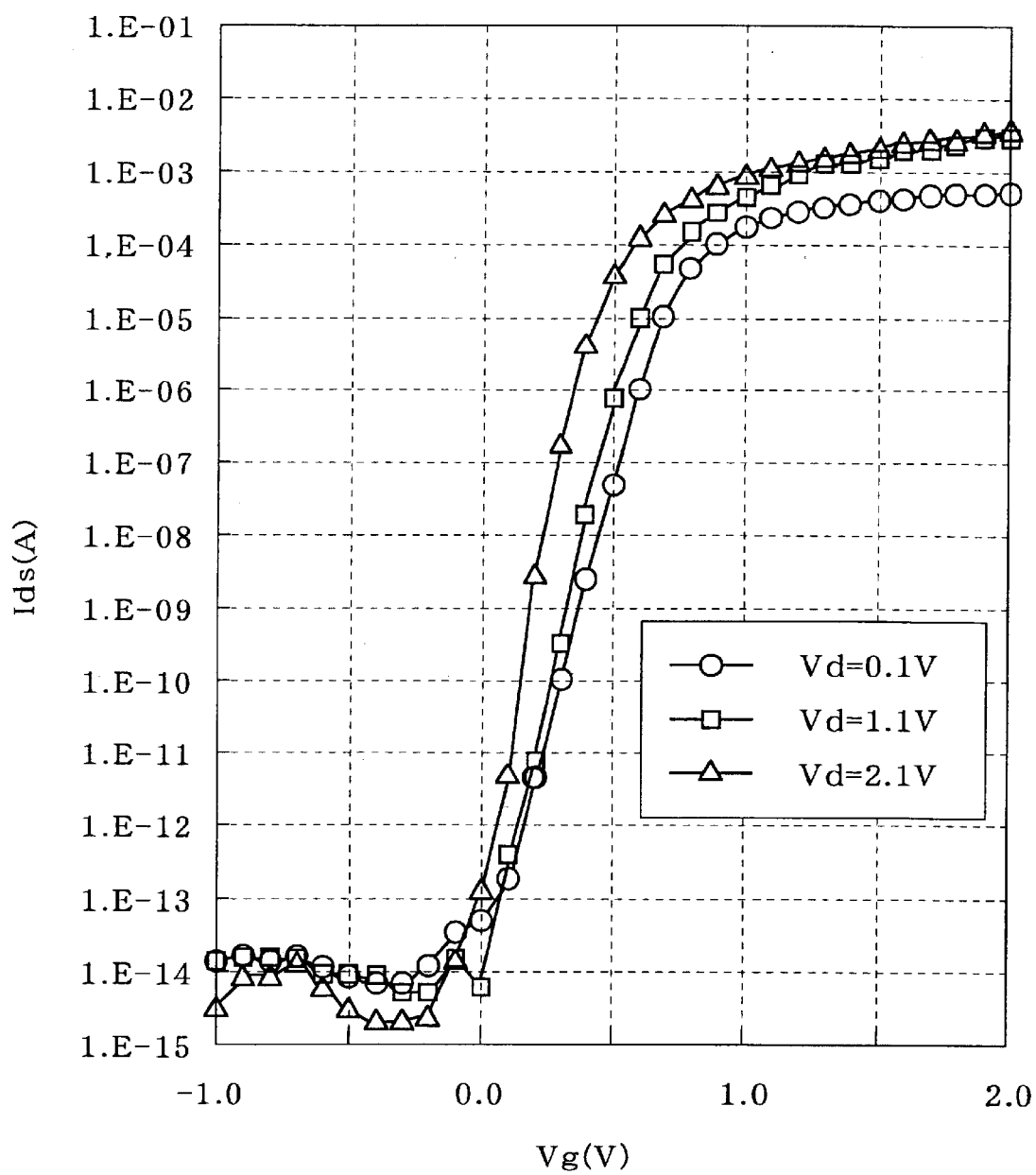
FIG. 35 is a graph of the characteristics of a conventional floating-body type of field-effect transistor (partially depleted)

The relationship between the gate voltage (Vg) and the drain-source current (Ids) of a conventional floating-body type of field-effect transistor (partially depleted) is shown graphically in FIG. 35. The conditions are as follows:

| Operating mode | Partially depleted |
|---|---|
| Thickness of body region | 175 nm |
| Isolation method | LOCOS |
| Width of gate electrode | 25 μm |
| Length of gate electrode | 0.6 μm |
| Drain voltage (Vd) | 0.1 V, 1.1 V, 2.1 V |
| Resistance portion | None |

As is clear from the graph, when the gate voltage (Vg) is at the vicinity of 0.5 V but the drain voltage (Vd) becomes higher, the current (Ids) rises more sharply. This is because the substrate floating effect occurs as the drain voltage (Vd) becomes larger, causing a drop in the threshold value.

A current (Ids) of 1.E-03 (A), for example, means a current of 1 mA flowing between the drain and the source.

$$1.\text{E}{-}03\ (A) = 1.0 \times 10^{-3}\ (A) = 1.0\ (mA)$$

Note that the vertical axis (Ids) in the Vg-Ids characteristics shown in FIGS. 35 to 41 indicates the magnitude of current between the gate and source added to the current between the drain and the source, in each field-effect transistor.

Figure 36:
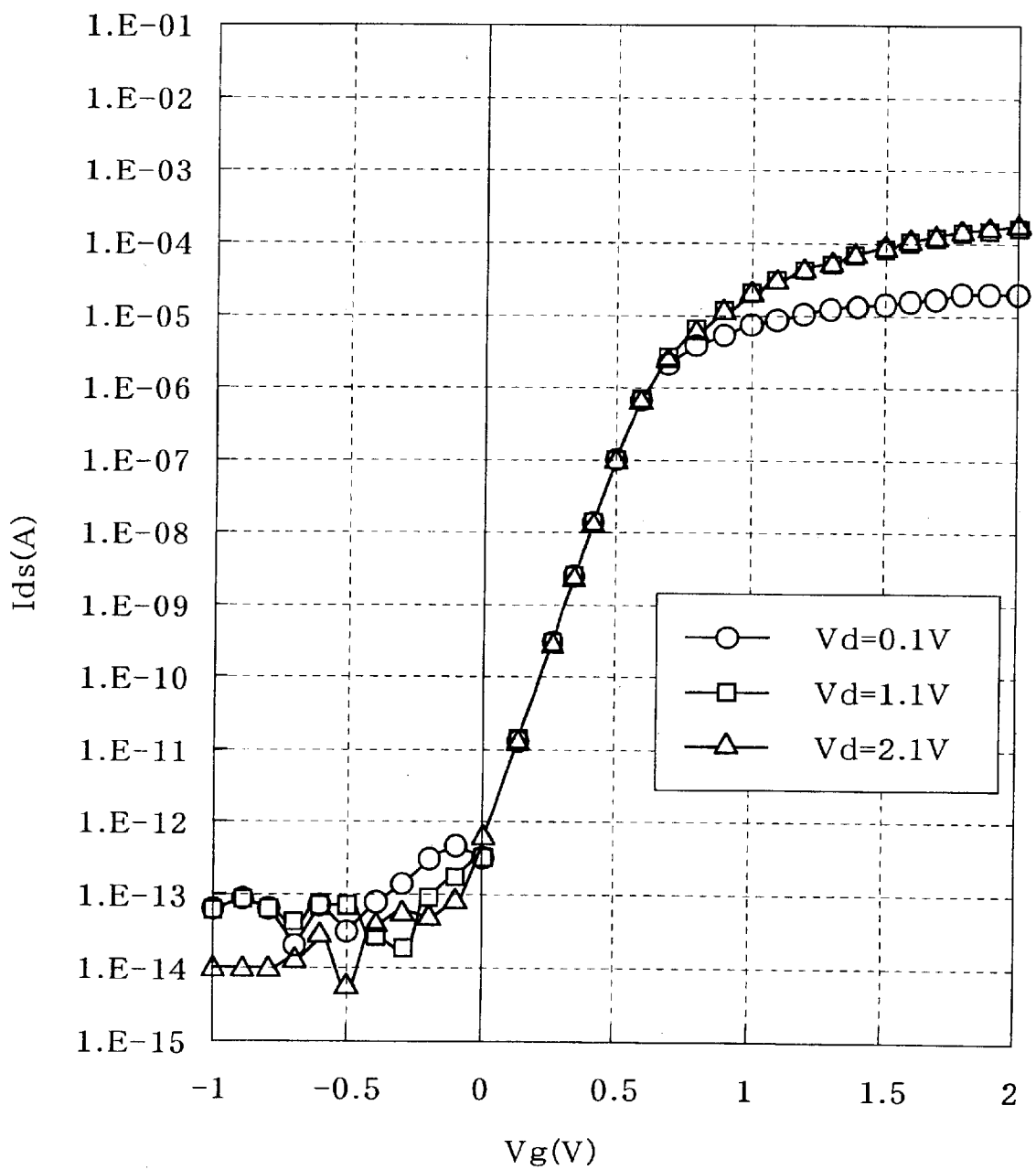
FIG. 36 is a graph of the characteristics of a conventional floating-body type of field-effect transistor (fully depleted)

The relationship between the gate voltage (Vg) and the drain-source current (Ids) of a conventional floating-body type of field-effect transistor (fully depleted) is shown graphically in FIG. 36. The conditions are as follows:

| Operating mode | Fully depleted |
|---|---|
| Thickness of body region | 55 nm |
| Isolation method | LOCOS |
| Width of gate electrode | 25 μm |
| Length of gate electrode | 0.6 μm |
| Drain voltage (Vd) | 0.1 V, 1.1 V, 2.1 V |
| Resistance portion | None |

As is clear from the graph, the same phenomenon occurs in a fully depleted transistor as in a partially depleted one.

Figure 37:
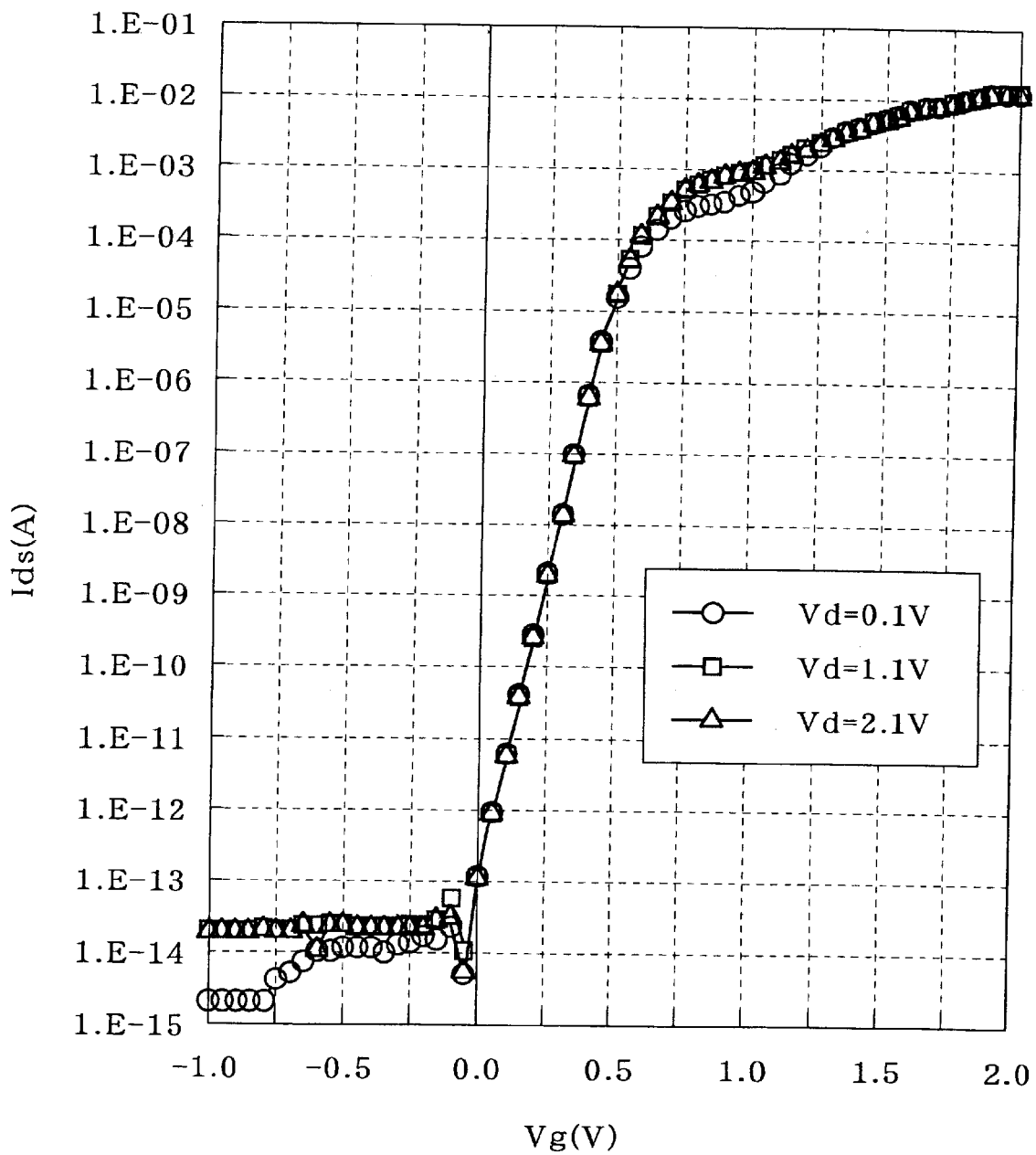
FIG. 37 is a graph of the characteristics of a conventional DTMOS type of field-effect transistor (partially depleted)

The relationship between the gate voltage (Vg) and the drain-source current (Ids) in a conventional DTMOS type of field-effect transistor (partially depleted) is shown graphically in FIG. 37. The conditions are as follows:

| Operating mode | Partially depleted |
|---|---|
| Thickness of body region | 175 nm |
| Isolation method | LOCOS |
| Width of gate electrode | 25 μm |
| Length of gate electrode | 0.6 μm |
| Drain voltage (Vd) | 0.1 V, 1.1 V, 2.1 V |
| Resistance portion | None |

As is clear from the graph, the phenomenon that occurs in a conventional floating-body type of field-effect transistor (partially depleted), as described above, does not occur in a conventional DTMOS type of field-effect transistor, even a partially depleted one.

However, the current (Ids) increases strangely in the region from a gate voltage (Vg) of 0.8 V upwards, in comparison with FIG. 35. This is because the current (Igs) flowing from the gate electrode, through the body region, and into the source region is added to the current between the drain and source. This increase in the current (Igs) is the reason why there is a limit to the power voltage range wherein the DTMOS type of field-effect transistor without the resistance portion R can be practically used.

Figure 38:
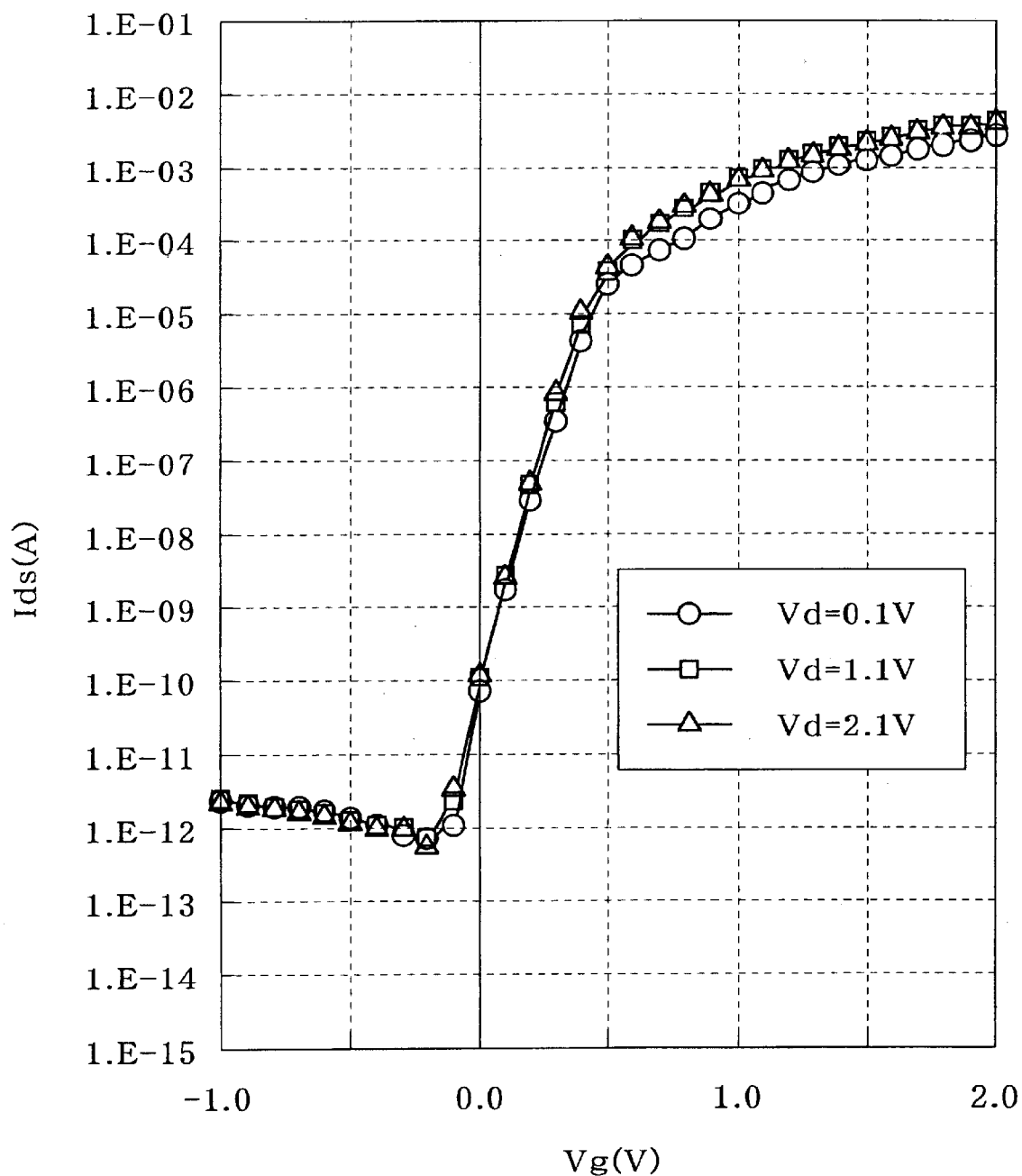
FIG. 38 is a graph of the characteristics of a conventional DTMOS type of field-effect transistor (fully depleted)

The relationship between the gate voltage (Vg) and the drain-source current (Ids) of a conventional DTMOS type of field-effect transistor (fully depleted) is shown graphically in FIG. 38. The conditions are as follows:

| Operating mode | Fully depleted |
|---|---|
| Thickness of body region | 55 nm |
| Isolation method | LOCOS |
| Width of gate electrode | 25 μm |
| Length of gate electrode | 0.6 μm |
| Drain voltage (Vd) | 0.1 V, 1.1 V, 2.1 V |
| Resistance portion | None |

As is clear from the graph, the phenomenon that occurs in a conventional floating-body type of field-effect transistor (partially depleted), as described above, does not occur in a conventional DTMOS type of field-effect transistor (fully depleted).

However, the current (Ids) increases strangely in the region from a gate voltage (Vg) of the vicinity of 0.7 V upwards, in comparison with FIG. 36. This is because the current (Igs) flowing from the gate electrode, through the body region, and into the source region is added to the current between the drain and source.

Figure 39:
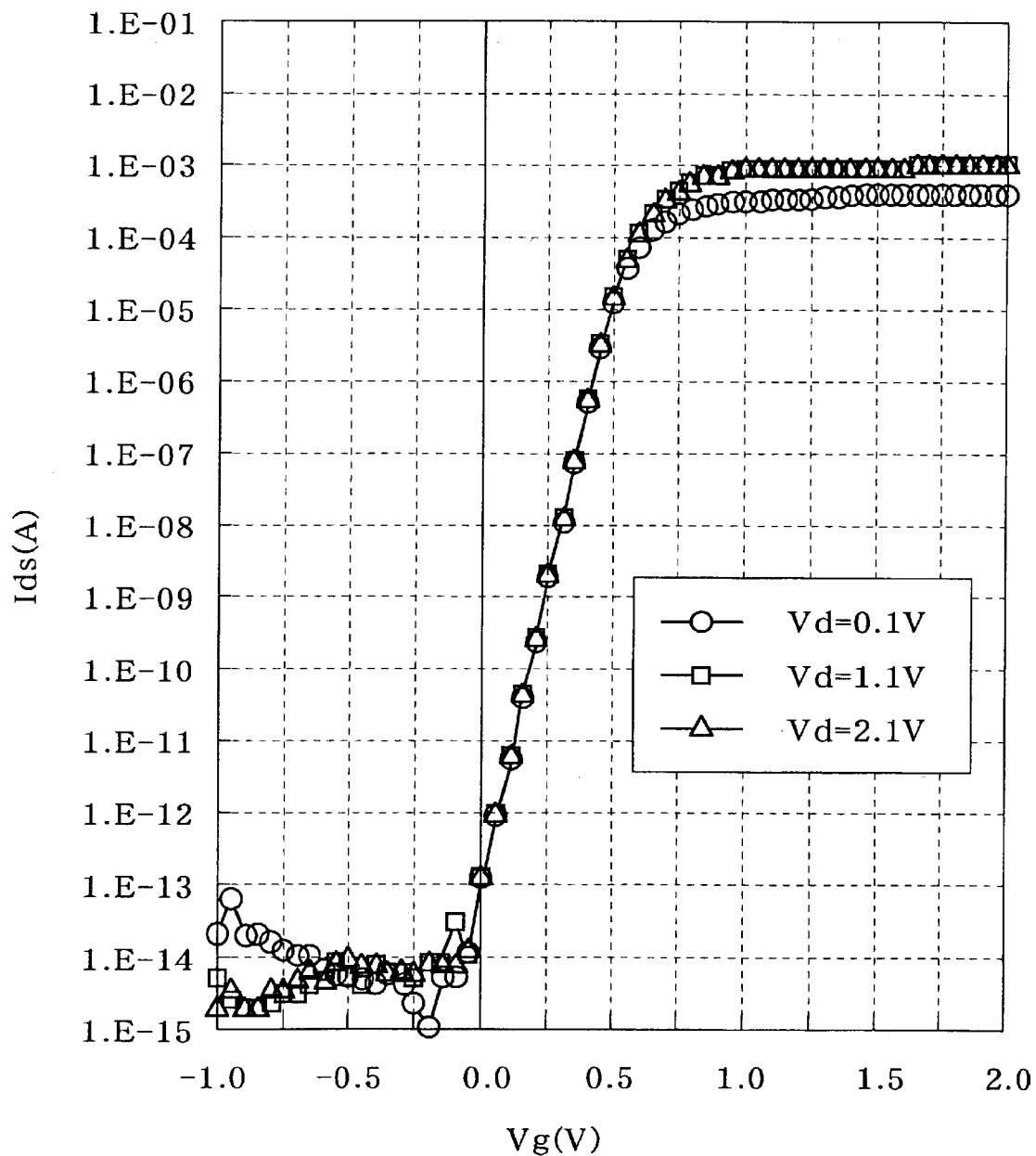
FIG. 39 is a graph of the characteristics of a DTMOS type of field-effect transistor (partially depleted) in accordance with an embodiment of the present invention.

The relationship between the gate voltage (Vg) and the drain-source current (Ids) of a DTMOS type of field-effect transistor (partially depleted) in accordance with an embodiment of the present invention is shown graphically in FIG. 39. The conditions are as follows:

| Operating mode | Partially depleted |
|---|---|
| Thickness of body region | 175 nm |
| Isolation method | LOCOS |
| Width of gate electrode | 25 μm |
| Length of gate electrode | 0.6 μm |
| Drain voltage (Vd) | 0.1 V, 1.1 V, 2.1 V |
| Resistance portion | Present (50 KΩ) |

The DTMOS type of field-effect transistor in accordance with an embodiment of the present invention is provided with the resistance portion R. As is clear from the graph, the current (Ids) in the DTMOS type of field-effect transistor (partially depleted) in accordance with an embodiment of the present invention is restrained to within the vicinity of 1.E-03, even when the gate voltage (Vg) is comparatively high (1.0 V or higher). This is because the current between the body region and the source region is restrained by the resistance portion R. The DTMOS type of field-effect transistor (partially depleted) in accordance with an embodiment of the present invention can therefore have a reduced current (Ids), and thus a reduced power consumption, even when used under conditions of a comparatively high gate voltage. In contrast thereto, the current (Ids) in a conventional DTMOS type of field-effect transistor (partially depleted) that is not provided with the resistance portion R (see FIG. 37) cannot be restrained to within the vicinity of 1.E-03 if the gate voltage (Vg) becomes comparatively high (1.0 V or higher).

In addition, a DTMOS type of field-effect transistor (partially depleted) in accordance with an embodiment of the present invention does not experience the same phenomenon that occurs in the conventional floating-body type of field-effect transistor (partially depleted), as described above.

Figure 40:
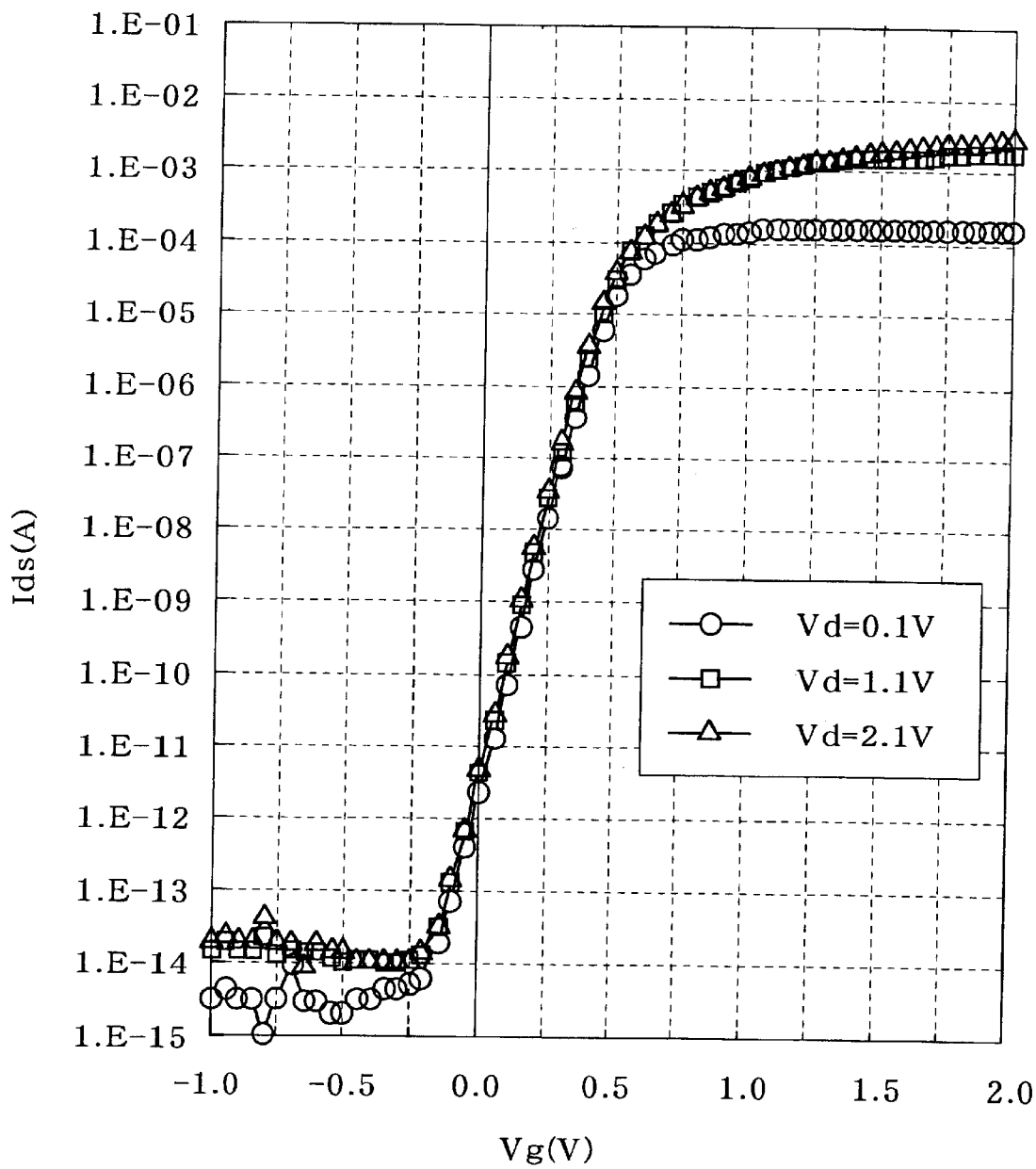
FIG. 40 is a graph of the characteristics of a DTMOS type of field-effect transistor (fully depleted) in accordance with an embodiment of the present invention.

The relationship between the gate voltage (Vg) and the drain-source current (Ids) of a DTMOS type of field-effect transistor (fully depleted) in accordance with an embodiment of the present invention is shown graphically in FIG. 40. The conditions are as follows:

| Operating mode | Fully depleted |
|---|---|
| Thickness of body region | 55 nm |
| Isolation method | LOCOS |
| Width of gate electrode | 25 μm |
| Length of gate electrode | 0.6 μm |
| Drain voltage (Vd) | 0.1 V, 1.1 V, 2.1 V |
| Resistance portion | Present (50 kΩ) |

The excessive increase in the current (Ids) that can be seen in FIG. 38 is not seen in FIG. 40, even when Vg is 0.7 V or greater. This is because the current (Igs) is restricted by the resistance portion R.

In addition, a DTMOS type of field-effect transistor (fully depleted) in accordance with an embodiment of the present invention does not experience the same phenomenon that occurs in the conventional floating-body type of field-effect transistor (partially depleted), as described above.

Figure 41:
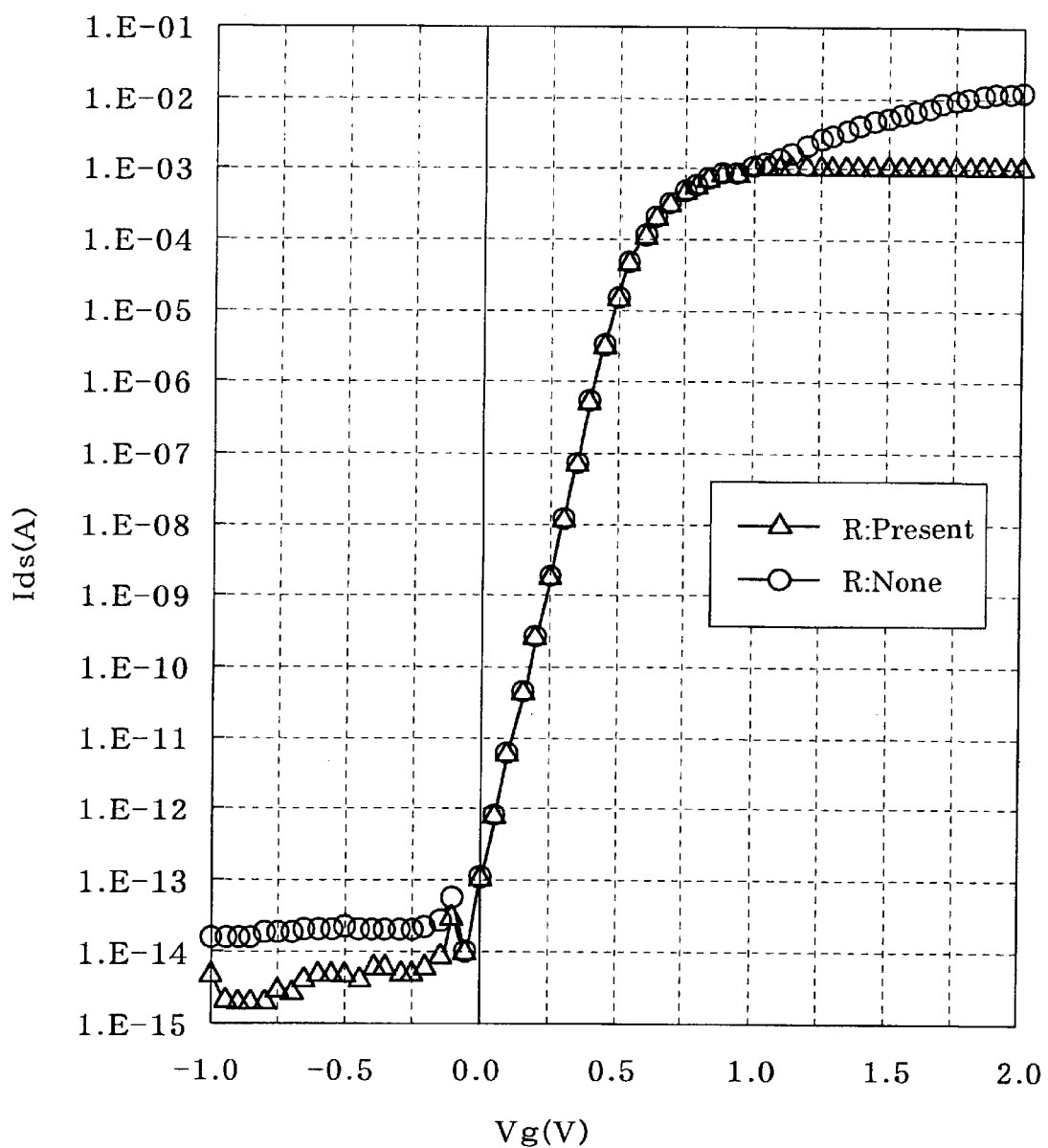
FIG. 41 is a comparative graph of the characteristics of a DTMOS type of field-effect transistor (partially depleted) having a resistance portion R in accordance with an embodiment of the present invention and a conventional DTMOS type of field-effect transistor (partially depleted) that is not provided with a resistance portion R.

A comparative graph of the characteristics of a DTMOS type of field-effect transistor (partially depleted) having a resistance portion R in accordance with an embodiment of the present invention and a conventional DTMOS type of field-effect transistor (partially depleted) that is not provided with a resistance portion R is shown in FIG. 41. In other words, FIG. 41 shows the part of the graph of FIG. 37 where the drain voltage (Vd) is 1.1 V and part of FIG. 39 where the drain voltage (Vd) is 1.1 V. It is clear from this graph that the current (Ids) of the DTMOS type of field-effect transistor with the resistance portion R is less than the current (Ids) of the DTMOS type of field-effect transistor without the resistance portion R when the gate voltage (Vg) is comparatively high (1.0 V or higher).

Figure 42:
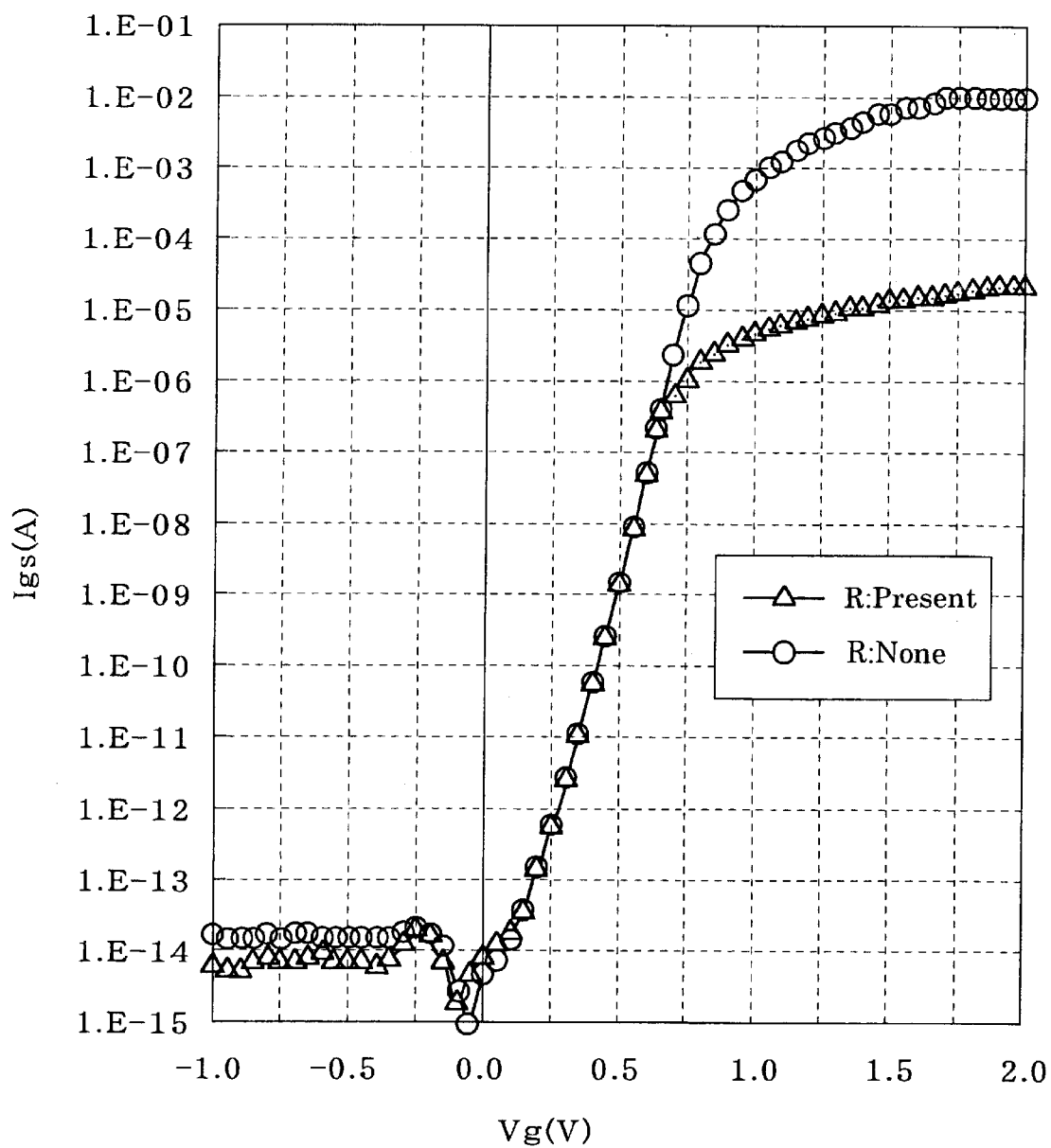
FIG. 42 is another comparative graph of the characteristics of a DTMOS type of field-effect transistor (partially depleted) having a resistance portion R in accordance with an embodiment of the present invention and a conventional DTMOS type of field-effect transistor (partially depleted) that is not provided with a resistance portion R with respect to the relationship between the gate voltage Vg and the current Igs flowing from the gate electrode through the body region and into the source region.

Another comparative graph of the characteristics of a DTMOS type of field-effect transistor (partially depleted) having a resistance portion R in accordance with an embodiment of the present invention and a conventional DTMOS type of field-effect transistor (partially depleted) that is not provided with a resistance portion R with respect to the relationship between the gate voltage (vg) and the current (Igs) flowing from the gate electrode, through the body region, and into the source region of a DTMOS type of field-effect transistor is shown in FIG. 42. The conditions are as follows:

| Operating mode | Partially depleted |
|---|---|
| Thickness of body region | 175 nm |
| Isolation method | LOCOS |
| Width of gate electrode | 25 μm |
| Length of gate electrode | 0.6 μm |

As is clear from the graph, the current (Igs) is restrained in the DTMOS with the resistance portion R (56 k Ω), in comparison with the DTMOS without the resistance portion R, when the gate voltage (Vg) is comparatively high (0.7 to 0.8 V or higher). As described above, the current (Ids) can be held to a comparatively low magnitude in a DTMOS type of field-effect transistor (partially depleted) in accordance with an embodiment of the present invention because the current (Igs) is restrained.

What is claimed is:

1. A metal insulator semiconductor (MIS) field-effect transistor of a silicon-on-insulator (SOI) structure, comprising:
    a source region;
    a drain region;
    a body region;
    a gate electrode; and
    a PN junction portion;
    wherein the body region is interposed between the source region and the drain region;
    wherein the body region is electrically connected to the gate electrode by the PN junction portion; and
    wherein the PN junction portion is disposed in such a manner that when a voltage is applied to the gate electrode, a reverse voltage is applied to the PN junction portion.

2. The MIS field-effect transistor of the SOI structure as defined in claim 1, further comprising an extended portion,
    wherein the extended portion is formed to extend from an end portion of the gate electrode and includes the PN junction portion.

3. The MIS field-effect transistor of the SOI structure as defined in claim 2, being formed on a silicon-on-insulator (SOI) substrate and further comprising an interlayer dielectric and a connecting layer,
    wherein the interlayer dielectric is formed to cover the extended portion and a silicon single crystal layer of the SOI substrate;
    wherein the interlayer dielectric has a hole through which is exposed part of the extended portion and the silicon single crystal layer of the SOI substrate; and
    wherein the connecting layer is formed in the hole to electrically connect the extended portion to the silicon single crystal layer of the SOI substrate.

4. The MIS field-effect transistor of the SOI structure as defined in claim 2, being formed on a silicon-on-insulator (SOI) substrate and further comprising an insulating layer,
    wherein the insulating layer is positioned between the extended portion and a silicon single crystal layer of the SOI substrate;
    wherein the insulating layer has a hole through which is exposed part of the silicon single crystal layer of the SOI substrate; and
    wherein the extended portion is electrically connected to the silicon single crystal layer of the SOI substrate through the hole.

5. The MIS field-effect transistor of the SOI structure as defined in claim 1, being formed on a silicon-on-insulator (SOI) substrate,
    wherein the PN junction portion is formed within a silicon single crystal layer of the SOI substrate.

6. The MIS field-effect transistor of the SOI structure as defined in claim 5, further comprising an interlayer dielectric and a wiring layer,
    wherein the interlayer dielectric is formed to cover the silicon single crystal layer of the SOI substrate;
    wherein the interlayer dielectric has a first hole through which is exposed part of the silicon single crystal layer of the SOI substrate, and a second hole through which is exposed part of the gate electrode;
    wherein the wiring layer is formed on the interlayer dielectric; and
    wherein the wiring layer is electrically connected to the silicon single crystal layer of the SOI substrate by the first hole, and is also electrically connected to the gate electrode by the second hole.

7. The MIS field-effect transistor of the SOI structure as defined in claim 1, wherein the MIS field-effect transistor is partially depleted.

8. The MIS field-effect transistor of the SOI structure as defined in claim 1, wherein the MIS field-effect transistor is fully depleted.

9. The MIS field-effect transistor of the SOI structure as defined in claim 2, wherein the material of the PN junction portion comprises polysilicon.

10. The MIS field-effect transistor of the SOI structure as defined in claim 5, wherein the material of the PN junction portion comprises silicon single crystal.

11. The MIS field-effect transistor of the SOI structure as defined in claim 1, wherein the MIS field-effect transistor is of an n-channel type;

wherein the PN junction portion is a connection between a p-type semiconductor portion and an n-type semiconductor portion;

wherein the p-type semiconductor portion is electrically connected to the body region; and wherein the n-type semiconductor portion is electrically connected to the gate electrode.

12. The MIS field-effect transistor of the SOI structure as defined in claim 1, wherein the MIS field-effect transistor is of a p-channel type;

wherein the PN junction portion is a connection between a p-type semiconductor portion and an n-type semiconductor portion;

wherein the p-type semiconductor portion is electrically connected to the gate electrode; and wherein the n-type semiconductor portion is electrically connected to the body region.

* * * * *